United States Patent
Nagashima

(10) Patent No.: US 8,507,889 B2
(45) Date of Patent: Aug. 13, 2013

(54) NONVOLATILE SEMICONDUCTOR MEMORY DEVICE COMPRISING MEMORY CELL ARRAY HAVING MULTILAYER STRUCTURE

(75) Inventor: Hiroyuki Nagashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 562 days.

(21) Appl. No.: 12/726,635

(22) Filed: Mar. 18, 2010

(65) Prior Publication Data

US 2010/0237320 A1    Sep. 23, 2010

(30) Foreign Application Priority Data

Mar. 23, 2009    (JP) .................................. 2009-069788

(51) Int. Cl.
*H01L 47/00*    (2006.01)
*H01L 29/06*    (2006.01)
(52) U.S. Cl.
USPC .................................................. 257/4; 257/5
(58) Field of Classification Search
USPC ............ 257/2–5, E31.001, E31.027, E31.029
See application file for complete search history.

(56) References Cited

U.S. PATENT DOCUMENTS

| 7,220,983 | B2 | 5/2007 | Lung |
| 7,259,038 | B2 * | 8/2007 | Scheuerlein .................... 438/95 |
| 2007/0132049 | A1 | 6/2007 | Stipe |
| 2007/0155093 | A1 | 7/2007 | Jeong et al. |
| 2008/0258129 | A1 | 10/2008 | Toda |

FOREIGN PATENT DOCUMENTS

| JP | 2007-165873 | 6/2007 |
| JP | 2010-532569 | 10/2010 |
| KR | 10-2004-0107487 | 12/2004 |
| KR | 10-2007-0062435 | 6/2007 |
| WO | WO 2008/047530 A1 | 4/2008 |
| WO | WO 2008/062688 A1 | 5/2008 |
| WO | WO 2009/005700 A2 | 1/2009 |
| WO | WO 2009/005700 A3 | 1/2009 |

OTHER PUBLICATIONS

Office Action issued Jun. 28, 2011, in Japanese Patent Application No. 2009-069788 (with English-language translation).
Korean Office Action issued May 24, 2011, in Patent Application No. 10-2010-0020249 (with English-language translation).
Office Action mailed Apr. 23, 2013 in Japanese Application No. 099105045 (w/English language translation).

* cited by examiner

*Primary Examiner* — Hung Vu
(74) *Attorney, Agent, or Firm* — Oblon, Spivak, McClelland, Maier & Neustadt, L.L.P.

(57) ABSTRACT

A nonvolatile semiconductor memory device includes a memory cell array where a plurality of memory cell layers having a plurality of first and second wires which cross each other and a memory cell provided at each intersection of these first and second wires are laminated on top of each other, wherein the memory cells have a variable resistance element and a non-ohmic element laminated in the direction in which the memory cell layers are laminated and tapered in such a manner that the area in a cross section gradually becomes smaller from the bottom memory cell layer towards the top memory cell layer, and the variable resistance element and the non-ohmic element in the memory cells in a certain memory cell layer are laminated in the same order as the variable resistance element and the non-ohmic element of the memory cells in another memory cell layer.

14 Claims, 17 Drawing Sheets

NONVOLATILE SEMICONDUCTOR MEMORY DEVICE COMPRISING MEMORY CELL ARRAY HAVING MULTILAYER STRUCTURE

CROSS-REFERENCE TO RELATED APPLICATIONS

This application is based upon and claims the benefit of priority from the prior Japanese Patent Application No. 2009-69788, filed on Mar. 23, 2009, the entire contents of which are incorporated herein by reference.

BACKGROUND OF THE INVENTION

1. Field of the Invention

The present invention relates to a nonvolatile semiconductor device, and in particular, to a nonvolatile semiconductor memory device having a memory cell array with a multilayer structure.

2. Description of the Related Art

Flash memories in which memory cells having a floating gate structure are NAND- or NOR-connected to form a memory cell array have been well known as conventional nonvolatile memories that is electrically rewritable. In addition, ferroelectric memories are also known as nonvolatile memories that make high speed random access possible.

Meanwhile, resistance change memories using variable resistance elements as memory cells have been proposed as a technology for further miniaturizing memory cells. As for the variable resistance elements, phase change memory elements whose resistance value changes as a chalcogenide compound switches between a crystal and an amorphous state, MRAM elements in which the resistance changes due to the tunneling magnetoresistive effects, memory elements of a polymer ferroelectric RAM (PFRAM) in which resistive elements are formed of a conductive polymer, ReRAM elements in which resistance changes through the application of an electrical pulse, and the like are known (Patent Document 1: Japanese Patent Application Laid-Open No. 2006-344349, paragraph 0021).

In these resistance change memories, memory cells can be formed of a series circuit of a Schottky diode and a variable resistance element instead of a transistor, and therefore, a cross point structure in which memory cells are placed at intersections of upper and lower wires can be used. Thus, there are advantages in that it is easy to form and can be further integrated (Patent Document 2: Japanese Patent Application Laid-Open No. 2005-522045). In addition, a memory cell array can have a multilayer structure in these resistance change memories so that the capacity of the nonvolatile memory can be increased.

In the case where memory cells are laminated in different orders in the memory cell array during the process for forming a nonvolatile memory having such a multilayer structure, however, the properties of the memory cells become inconsistent in the memory cell array, which causes an error in the program operation, reading operation and the like.

SUMMARY OF THE INVENTION

According to an aspect of the present invention, there is provided a nonvolatile semiconductor memory device including a memory cell array in which a plurality of memory cell layers having a plurality of first and second wires which cross each other and a memory cell provided at each intersection of these first and second wires are laminated on top of each other, the memory cells having a variable resistance element and a non-ohmic element laminated in a direction in which the memory cell layers are laminated, and being tapered in such a manner that an area in a cross section gradually becomes smaller from a bottom memory cell layer towards a top memory cell layer, and the variable resistance element and the non-ohmic element of the memory cells being laminated in the same order between a certain memory cell layer and another memory cell layer.

According to another aspect of the present invention, there is provided a nonvolatile semiconductor memory device including a memory cell array where a plurality of memory cell layers having a plurality of first and second wires which cross each other and a memory cell provided at each intersection of these first and second wires are laminated on top of each other, the memory cells having a variable resistance element and a non-ohmic element laminated in a direction in which the memory cell layers are laminated, and being tapered in such a manner that an area in a cross section gradually becomes smaller from a bottom memory cell layer towards a top memory cell layer, and the variable resistance element and the non-ohmic element of the memory cells in a certain memory cell layer being laminated in the same order and have substantially the same size as the variable resistance element and the non-ohmic element of the memory cells in another memory cell layer.

According to still another aspect of the present invention, there is provided a method for manufacturing a nonvolatile semiconductor memory device, including: forming a semiconductor substrate; depositing a first interlayer insulating film above the semiconductor substrate; forming, in the first interlayer insulating film, a plurality of first trenches extending in a first direction and having such a depth as not to hit a top surface of the semiconductor substrate; filling the first trenches with a wire material to form a plurality of first wires extending in the first direction; sequentially layering a material for a first element and a material for a second element for forming memory cells in a lower layer; carrying out anisotropic etching on the materials for the first and second elements for forming the memory cells in the lower layer to form the memory cells in the lower layer at intersections of the first wires and a plurality of second wires to be formed afterwards so as to extend in a second direction that crosses the first direction in tapered pillar form where an area in a cross section gradually becomes smaller from the bottom layer towards the top layer in the multilayer structure; depositing a second interlayer insulating film to a height above the top surface of the memory cells in the lower layer; forming, in the second interlayer insulating film, a plurality of second trenches extending in the second direction and having such a depth as to hit the top surface of the memory cells in the lower layer; filling the second trenches with a wire material to form the second wires; sequentially layering the material for the first element and the material for the second element for forming memory cells in an upper layer; carrying out anisotropic etching on the materials for the first and second elements for forming the memory cells in the upper layer to form the memory cells in the upper layer at intersections of the second wires and a plurality of third wires to be formed afterwards so as to extend in the first direction in tapered pillar form where the area in the cross section gradually becomes smaller from the bottom layer towards the top layer in the multilayer structure, and depositing a third interlayer insulating film to a height above the top surface of the memory cells in the upper layer, forming, in the third interlayer insulating film, a plurality of third trenches extending in the first direction and having such a depth as to hit the top surface of the memory cells in the upper layer; and filling the third trenches with a wire material to form the plurality of third wires.

DETAILED DESCRIPTION OF THE EMBODIMENTS

In the following, nonvolatile semiconductor memory devices according to embodiments of the present invention are described in detail with reference to the drawings.

[First Embodiment]

[Entire Configuration]

Figure 1:
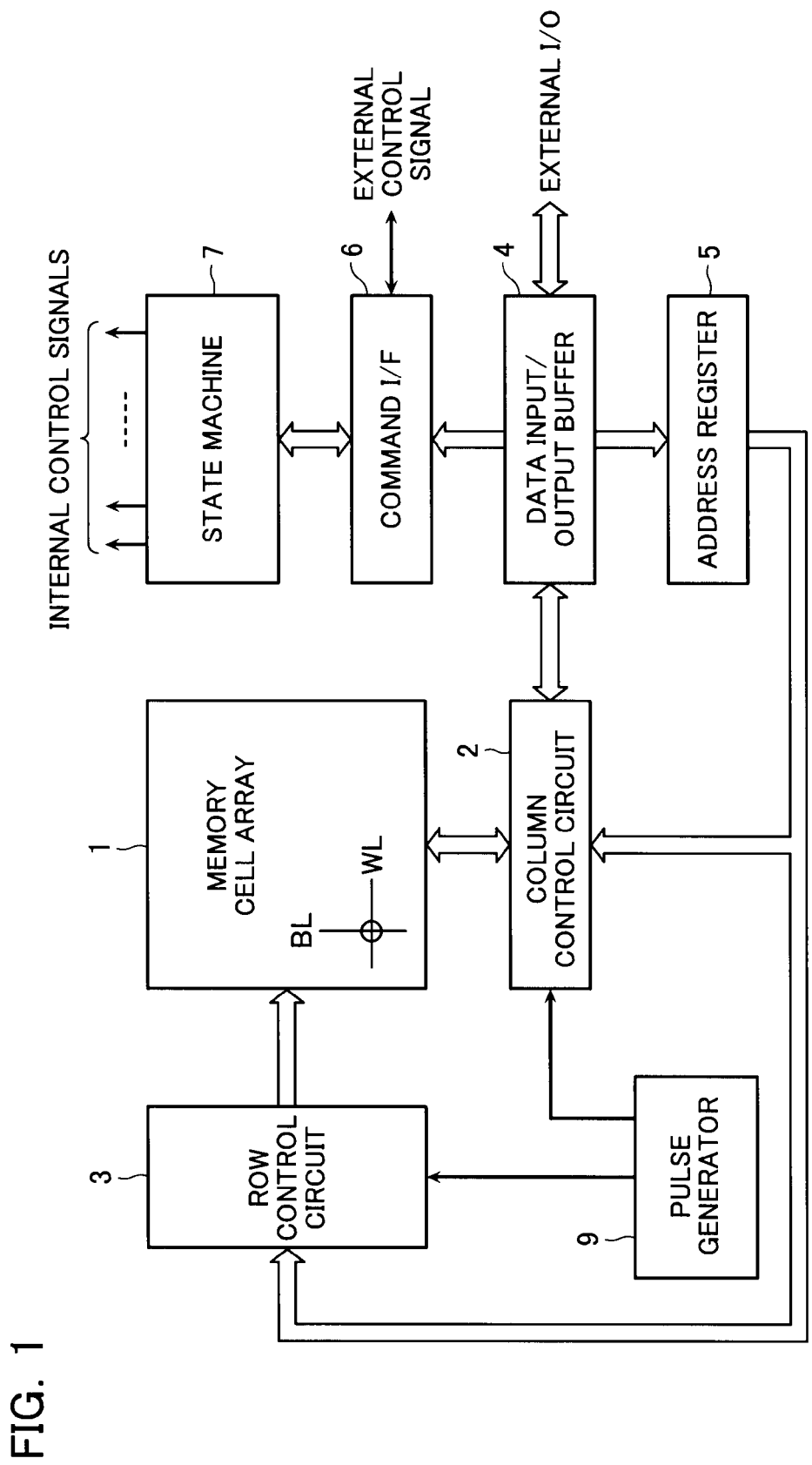
FIG. 1 is a block diagram showing a nonvolatile memory according to a first embodiment of the present invention.

FIG. 1 is a block diagram showing a nonvolatile memory according to a first embodiment of the present invention.

This nonvolatile memory is provided with a memory cell array 1 where memory cells using a later-described ReRAM (variable resistance element) are arranged in a matrix. A column control circuit 2, which controls bit lines BL in the memory cell array 1, erases data in memory cells, writes data into memory cells, and reads data from memory cells, is provided in a position adjacent to the memory cell array 1 in the direction of the bit lines BL (hereinafter referred to as direction of columns). In addition, a row control circuit 3, which selects a word line WL in the memory cell array 1, erases data in memory cells, writes data into memory cells, reads data from memory cells, and applies a voltage required to read data from memory cells, is provided in a position adjacent to the memory cell array 1 in the direction of the word lines WL, which are first wires in the memory cell array 1 (hereinafter referred to as direction of rows).

A data input/output buffer 4 is connected to an external host, not shown, via an I/O line, receives write data, receives erasure instructions, outputs read data, and receives address data and command data. The data input/output buffer 4 sends the received write data to the column control circuit 2, receives the data read from the column control circuit 2, and outputs the data to the outside. The address supplied from the outside to the data input/output buffer 4 is sent via an address register 5 to the column control circuit 2 and the row control circuit 3. In addition, the command supplied from the host to the data input/output buffer 4 is sent to a command interface 6. The command interface 6 receives an external control signal from the host, determines whether the data input into the data input/output buffer 4 is write data, a command or an address, and transfers the data to a state machine 7 as a reception command signal in the case where the data is a command. The state machine 7 manages the entire nonvolatile memory, and thus, receives a command from the host and reads, writes, erases, and inputs/outputs data. In addition, the external host receives status information managed by the state machine 7, and thus can determine the operation results. Furthermore, this status information is used for the control of write and erasure.

In addition, the state machine 7 controls a pulse generator 9. This control makes it possible for the pulse generator 9 to output a pulse having an arbitrary voltage at an arbitrary timing. Here, it is possible to transfer the generated pulse to an arbitrary wire selected by the column control circuit 2 and the row control circuit 3.

Here, it is possible to form a peripheral circuit element other than the memory cell array 1 on a silicon (Si) substrate directly beneath the memory cell array 1 formed in the wiring layer, and thus, it is possible to make the chip area of this nonvolatile memory approximately equal to the area of the memory cell array 1.

[Memory Cell Array and its Peripheral Circuit]

Figure 2:
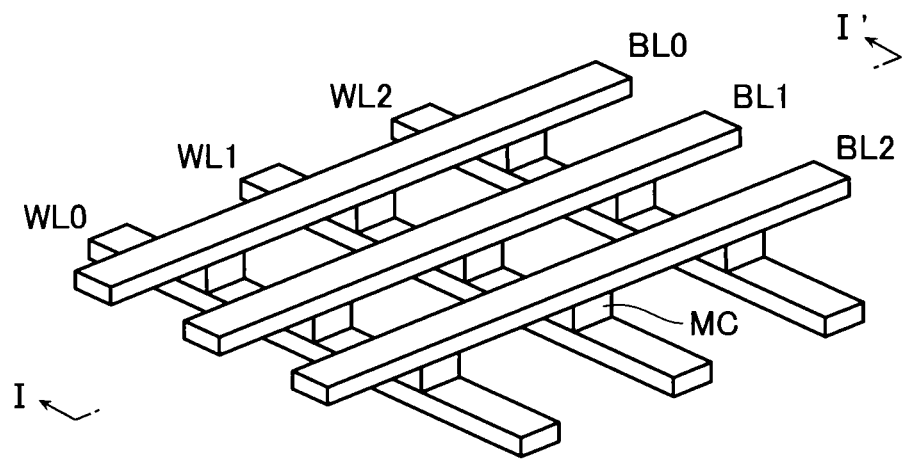
FIG. 2 is a perspective view showing part of the memory cell array of the nonvolatile memory according to the first embodiment.
Figure 3:
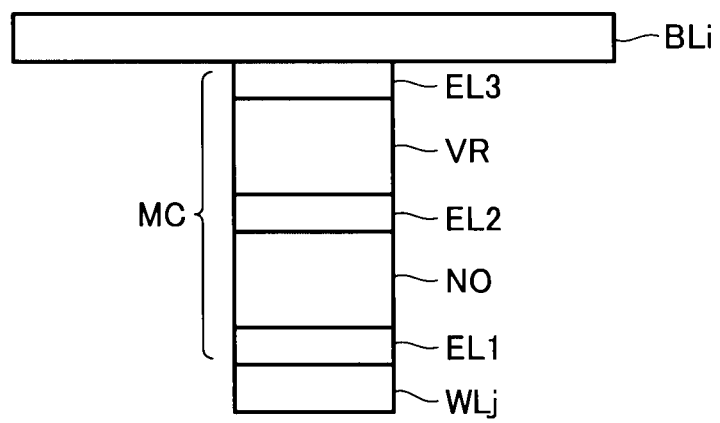
FIG. 3 is a cross-sectional view along line I-I' in FIG. 2 showing one memory cell as viewed in the direction of the arrows.

FIG. 2 is a perspective view showing part of the memory cell array 1, and FIG. 3 is a cross-sectional view along line I-I' in FIG. 2 showing one memory cell as viewed in the direction of the arrows.

A plurality of word lines WL0 to WL2 are provided in parallel as first wires, a plurality of bit lines BL0 to BL2 are provided in parallel as second wires crossing the first wires, and memory cells MC are provided at intersections of these wires so as to be sandwiched by the two wires. It is desirable for the first and second wires to be made of a material that is heat-resistant and has a low resistance value, and W, WSi, NiSi and CoSi can be used, for example.

As shown in FIG. 3, the memory cells MC are formed of a circuit where a variable resistance element VR and a non-ohmic element NO are connected in series.

The resistance value of the variable resistance element VR changes through the application of a voltage as a result of a change in the current, heat, chemical energy and the like, and electrodes EL2 and EL3, which function as a barrier metal and an adhesive layer, are provided above and beneath the variable resistance element VR. As the material for the electrodes, Pt, Au, Ag, TiAlN, SrRuO, Ru, RuN, Ir, Co, Ti, TiN, TaN, LaNiO, Al, PtIrO$_x$, PtRhO$_x$, Rh/TaAlN and the like can be used. In addition, it is possible to insert a metal film in order to make the orientation uniform. It is also possible to insert a buffer layer, a barrier metal layer and an adhesive layer separately.

A complex compound which includes a cation becoming a transition element and whose resistance value changes as the cation moves (ReRAM) can be used for the variable resistance element VR.

Figure 4:
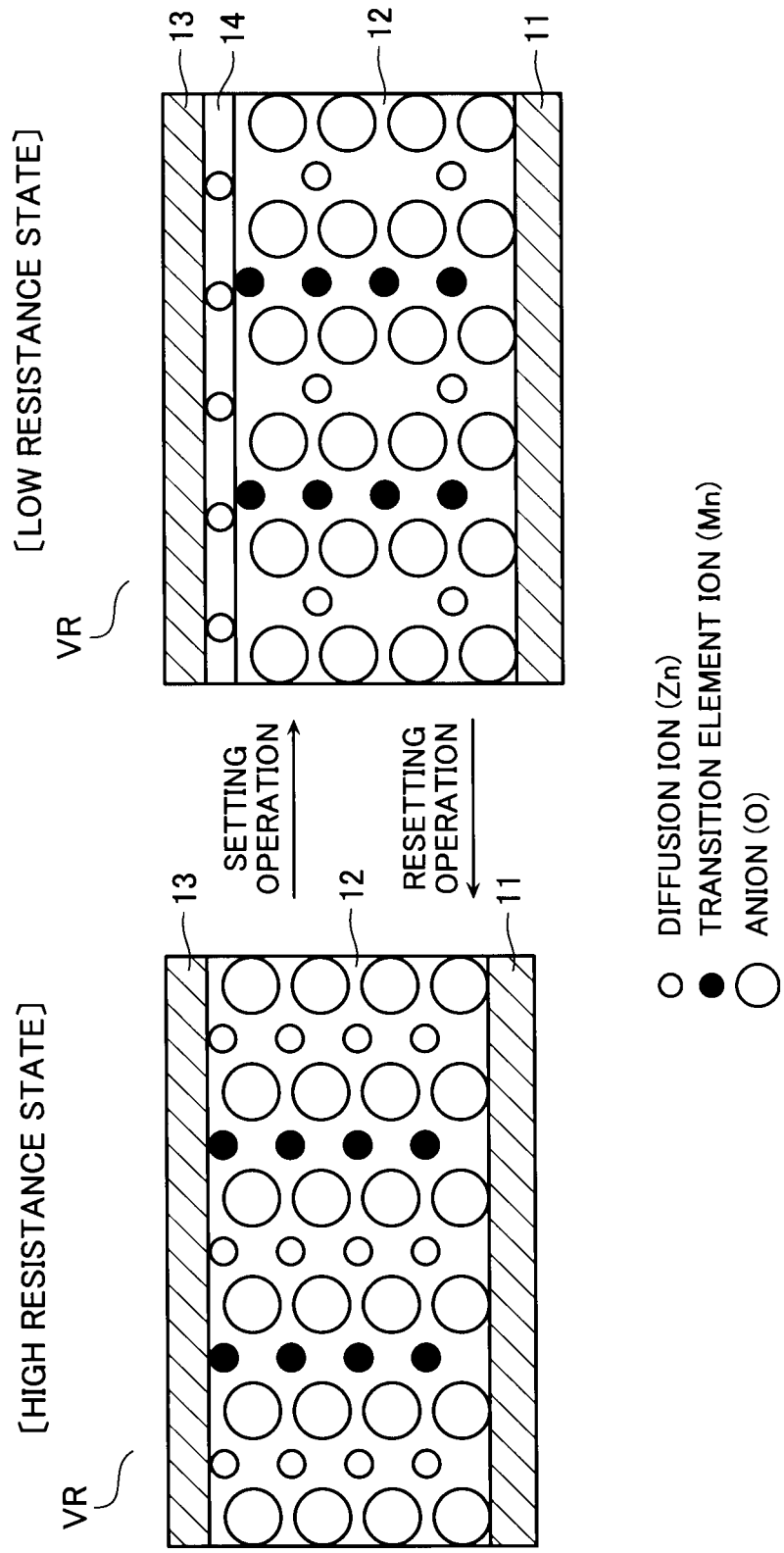
FIG. 4 is a schematic cross-sectional view showing an example of a variable resistance element according to the first embodiment.

FIG. 4 is a diagram showing an example of such a variable resistance element. This variable resistance element VR has a recording layer 12 placed between electrode layers 11 and 13. The recording layer 12 is formed of a complex compound having at least two types of cation elements. At least one type of the cation elements is a transition element having a d-orbital not completely filled with electrons, and the shortest distance between the adjacent cation elements is 0.32 nm or less. Specifically, it can be represented by the chemical formula $A_xM_yX_z$ (A and M are elements different from each other) and is formed of a material having a crystal structure, such as a spinel structure ($AM_2O_4$), an ilmenite structure ($AMO_3$), a delafossite structure ($AMO_2$), an LiMoN$_2$ structure ($AMN_2$), a wolframite structure ($AMO_4$), an olivine structure ($A_2MO_4$), a hollandite structure ($A_xMO_2$), a ramsdellite structure ($A_xMO_2$) and a perovskite structure ($AMO_3$).

In the example of FIG. 4, A is Zn, M is Mn and X is O. The small white circles, the large white circles and the small black circles in the recording layer 12 represent diffusion ions (Zn), anions (O) and transition element ions (Mn), respectively. The recording layer 12 is initially in a high resistance state, and when the electrode layer 11 is set at a fixed potential and a negative voltage is applied to the electrode layer 13, diffusion ions in the recording layer 12 partially move to the electrode layer 13 side so that the diffusion ions in the recording layer 12 are reduced relative to the anions. The diffusion ions that have moved towards the electrode layer 13 side receive electrons from the electrode layer 13 and are deposited as a metal so that a metal layer 14 is formed. Anions become excessive inside the recording layer 12, and consequently, the valence number in the transition element ions inside the recording layer 12 increases. As a result, the recording layer 12 has electron conduction through the injection of carriers, and thus, the setting operation is complete. For reproduction, a microscopic current having such a value that the resistance of the material forming the recording layer 12 does not change should flow. In order to reset the programmed state (low resistance state) to the initial state (high resistance state), a large current should flow through the recording layer 12 for a sufficient period of time for joule heating, for example, so that the oxidation-reduction reaction is accelerated in the recording layer 12. In addition, a resetting operation is possible by applying an electric field in the direction opposite to that at the time of setting.

The non-ohmic element NO is formed of any type of diode, such as (a) a Schottky diode, (b) a PN junction diode and (c) a PIN diode, (d) an MIM (metal-insulator-metal) structure or (e) an SIS (silicon-insulator-silicon) structure. Electrodes EL1 and EL2 for forming barrier metal layers and adhesive layers may be inserted herein. In addition, in the case where a diode is used, a unipolar operation can be carried out corresponding to the properties thereof, while in the case of an MIM structure or an SIS structure, it is possible to carry out a bipolar operation.

Here, a plurality of the above-described memory structures can be layered on top of each other so that a three-dimensional structure can be provided.

Figure 5:
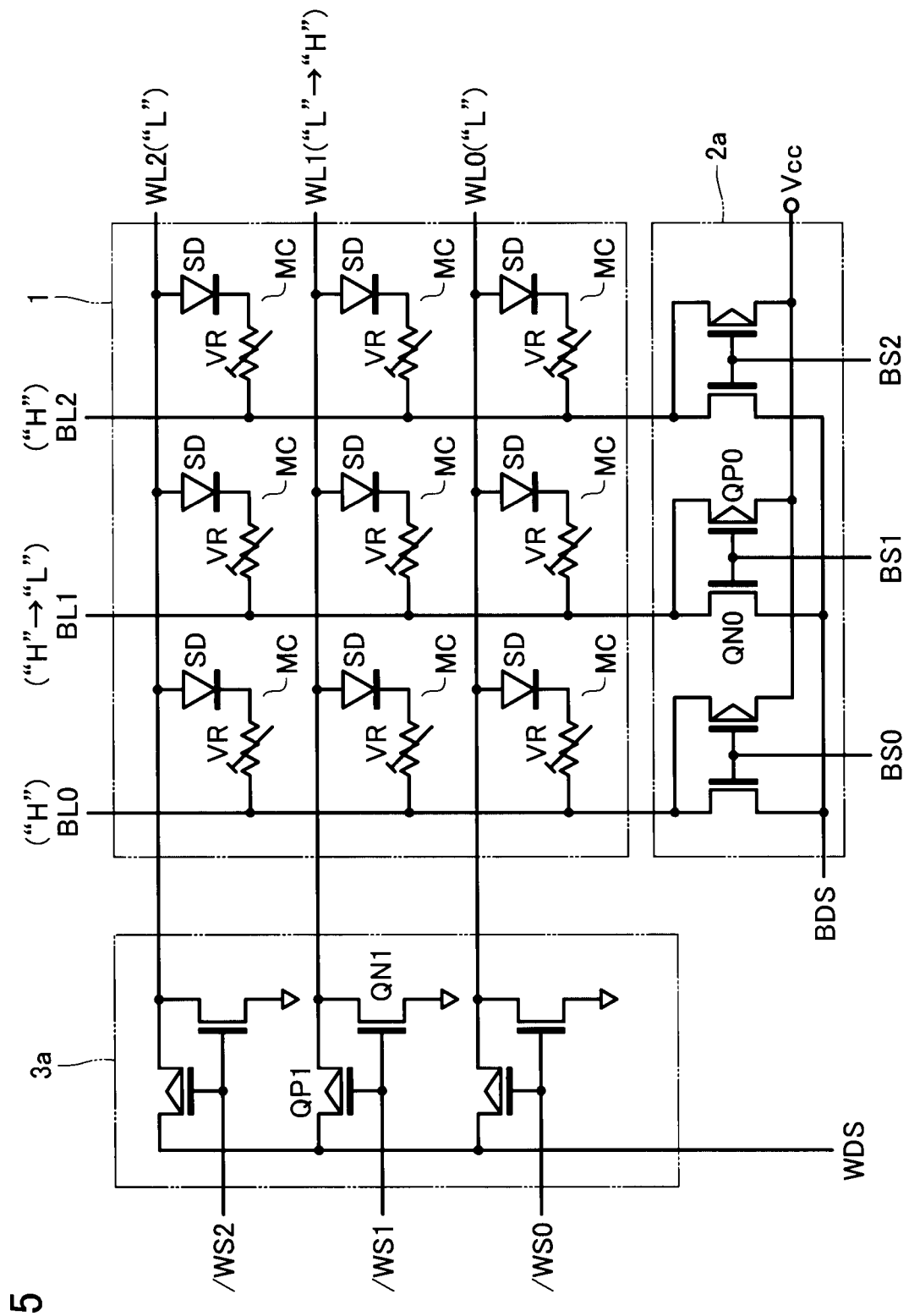
FIG. 5 is a circuit diagram showing the memory cell array and its peripheral circuit in the nonvolatile memory according to the first embodiment.

FIG. 5 is a circuit diagram showing the memory cell array 1 using diodes SD as non-ohmic elements NO, as well as its peripheral circuit. Here, in order to simplify the description, the circuit has a one layer structure.

In FIG. 5, the anode of the diodes SD that form the memory cells MC is connected to a word line WL, and the cathode is connected to a bit line BL via a variable resistance element VR. One end of each bit line BL is connected to a selection circuit 2a, which is part of the column control circuit 2. In addition, one end of each word line WL is connected to a selection circuit 3a, which is part of the row control circuit 3.

The selection circuit 2a is formed of selection PMOS transistors QP0 and selection NMOS transistors QN0, which are provided for every bit line BL and whose gates and drains are connected to each other. The source of the selection PMOS transistors QP0 is connected to a high potential power supply Vcc. The source of the selection NMOS transistors QN0 is connected to a bit line side drive sensing line BDS which applies a write pulse and through which a current to be detected at the time of data read flows. The common drain of the transistors QP0 and QN0 is connected to a bit line BL, and a bit line selection signal BSi for selecting a bit line BL is supplied to the common gate.

In addition, the selection circuit 3a is formed of selection PMOS transistors QP1 and selection NMOS transistors QN1, which are provided for every word line WL and whose gates and drains are connected to each other. The source of the selection PMOS transistors QP1 is connected to a word line side drive sensing line WDS which applies a write pulse and through which a current to be detected at the time of data read flows. The source of the selection NMOS transistors QN1 is connected to a low potential power supply Vss. The common drain of the transistors QP1 and QN1 is connected to a word line WL, and a word line selection signal /WSi for selecting a word line WL is supplied to the common gate.

Although an example which is appropriate for selecting individual memory cells is shown, in the case where data of a plurality of memory cells MC connected to a selected word line WL1 are collectively read, individual sense amplifiers are provided to the bit lines BL0 to BL2, so that the individual bit lines BL0 to BL2 are connected to the sense amplifiers via the selection circuit 2a for a bit line selection signal BS.

In addition, the memory cell array 1 may have diodes SD with the opposite polarity to the circuit shown in FIG. 5, so that a current flows from the bit line BL side to the word line WL side.

Figure 6:
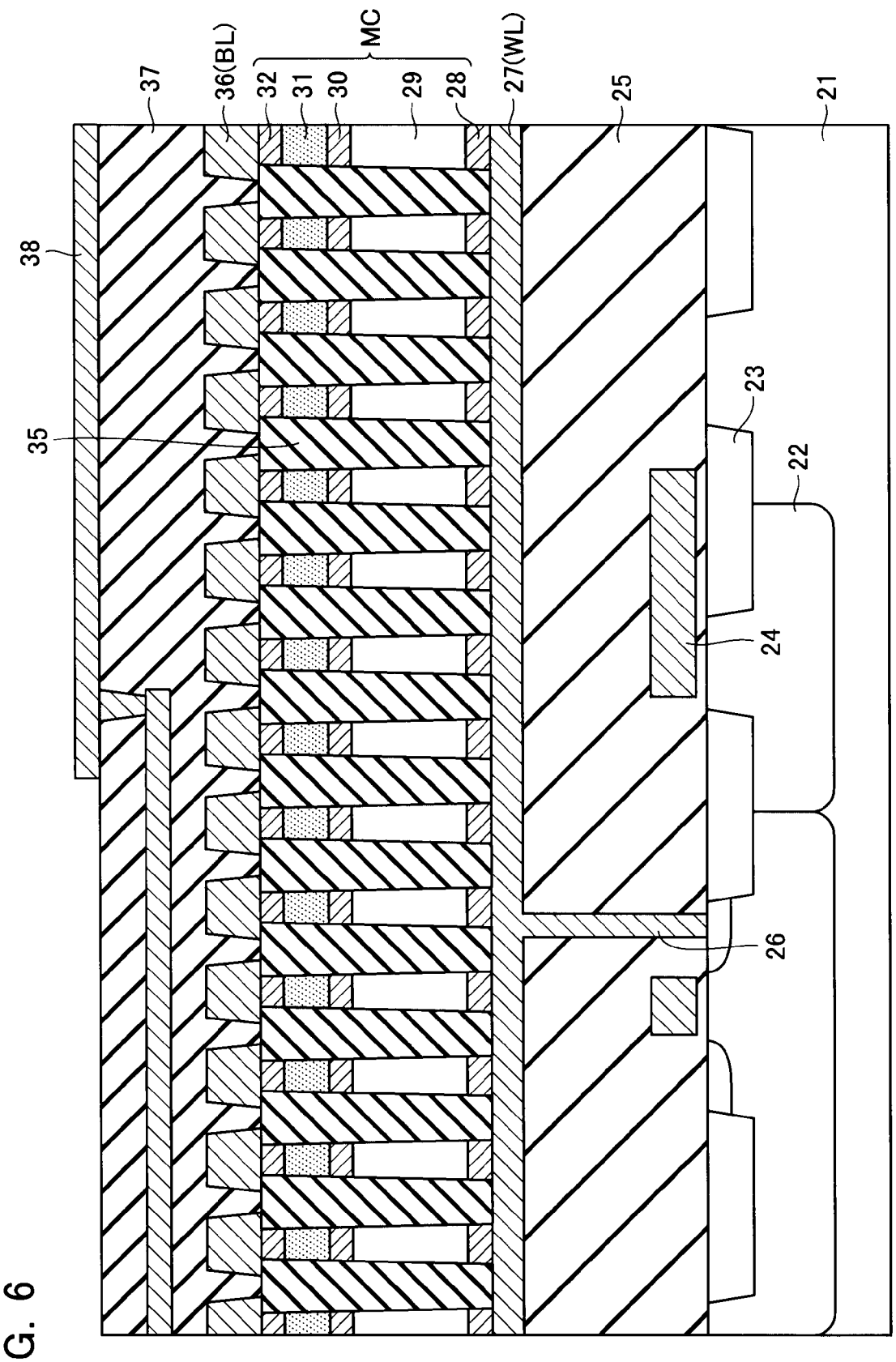
FIG. 6 is a cross-sectional view showing the nonvolatile memory according to the first embodiment.

FIG. 6 is a cross-sectional view showing a nonvolatile memory including one layer of the above-described memory structure. An impurity diffusion layer 23 and a gate electrode 24 of the transistors that form a peripheral circuit are formed on a silicon substrate 21 in which a well 22 is formed. A first interlayer insulating film 25 is deposited on top. Vias 26 that extend to the surface of the silicon substrate 21 are formed in this first interlayer insulating film 25. A first metal 27 for forming word lines WL which are first wires for the memory cell array is formed of a low resistance metal, such as W, on top of the first interlayer insulating film 25. A barrier metal 28 is formed in a layer above the first metal 27. Here, a barrier metal may also be formed in a layer beneath the first metal 27. The barrier metal can be formed of Ti and/or TiN. Non-ohmic elements 29, such as diodes, are formed above the barrier metal 28. A first electrode 30, a variable resistance element 31 and a second electrode 32 are formed on top of the non-ohmic elements 29 in this order. As a result, the layers from the barrier metal 28 to the second electrodes 32 are formed as memory cells MC. Here, barrier metals may be inserted beneath the first electrodes 30 and above the second electrodes 32, or barrier metals, adhesive layers and the like may be inserted beneath the second electrodes 32 and above the lower electrodes. In addition, a stopper for CMP or the like may be inserted above the second electrodes 32. The space between adjacent memory cells MC is filled with a second interlayer insulating film 34 and a third interlayer insulating film 35 (FIG. 6 does not show the second interlayer insulating film 34). Furthermore, a second metal 36 for forming bit lines BL which are second wires extending in a direction perpendicular to the word lines WL is formed above the memory cells MC in the memory cell array. A fourth interlayer insulating film 37 and a metal wiring layer 38 are formed on the second metal 36, so that a nonvolatile memory, which is a resistance change memory, is formed. Here, in order to provide a multilayer structure, the layers from the barrier metal 28 to the second electrode 32 and the formation of the second and third interlayer insulating films 34 and 35 between the memory cells MC are repeated the same number of times as the necessary number of layers.

[Method for Manufacturing Nonvolatile Memory]

Next, a method for manufacturing the nonvolatile memory according to the present embodiment shown in FIG. 6 is described. Here, in order to simplify the description, a case where there is one memory cell layer is described.

First, an FEOL (front end of line) process is carried out on a silicon substrate 21 in order to form transistors for forming a necessary peripheral circuit, and a first interlayer insulating film 25 is deposited on top. In addition, vias 26 are created.

Next, upper layers are formed above the first metal 27.

FIGS. 7 to 12 are perspective views illustrating the steps for forming the upper layers in sequence. The process for forming the upper layers is described below in reference to these FIGS. 7 to 12.

Figure 7:
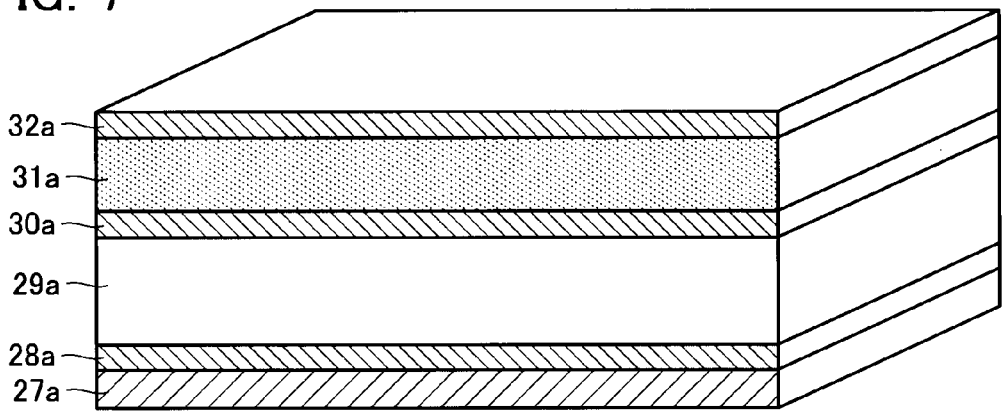
FIG. 7 is a perspective view showing one of the steps of forming an upper layer portion of the nonvolatile memory according to the first embodiment.

After the first interlayer insulating film 25 is formed and the vias 26 created as described above, a memory cell layer 27a (first wire material) is deposited on top as a first metal 27, and after that, in order to form memory cells, a layer 28a is formed as a barrier metal 28, a layer 29a is deposited as a non-ohmic element 29, a layer 30a is deposited as a first electrode 30, a layer 31a is deposited as a variable resistance element 31, and a layer 32a is deposited as a second electrode 32 in sequence. Through the above-described steps, the upper multilayer body in FIG. 7 is formed.

Figure 8:
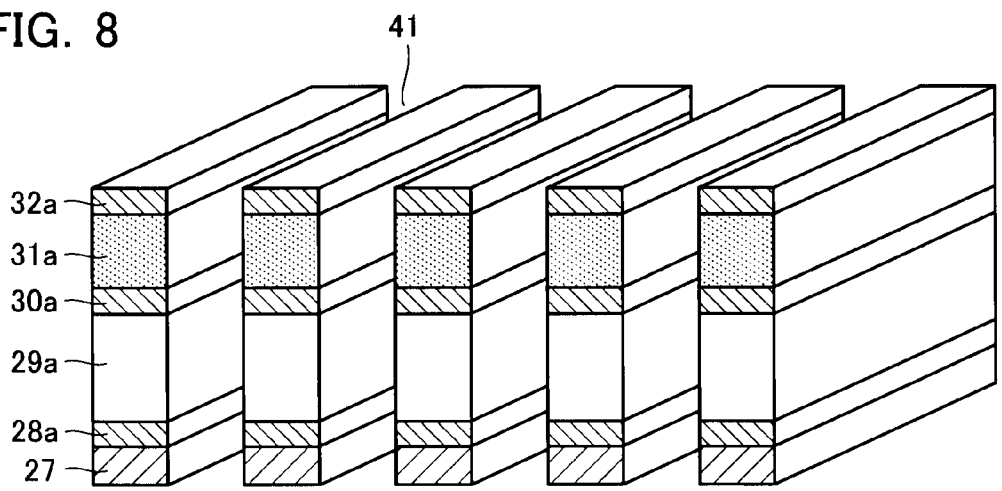
FIG. 8 is a perspective view showing the next step of forming the upper layer portion of the nonvolatile memory according to the first embodiment.

Next, a hard mask, such as of TEOS, not shown, is formed on top of the multilayer body and used as a mask for first anisotropic etching, so that first trenches 41 are created along the word lines WL as shown in FIG. 8, and thus, the multilayer body is divided.

Figure 9:
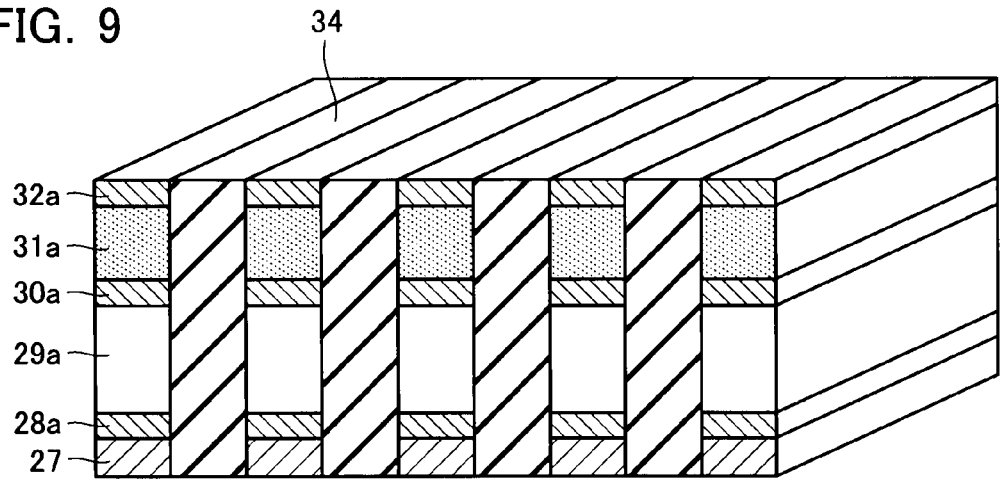
FIG. 9 is a perspective view showing the next step of forming the upper layer portion of the nonvolatile memory according to the first embodiment.

Next, the trenches 41 are filled with a second interlayer insulating film 34. It is appropriate for the material for the second interlayer insulating film 34 to have good insulating properties and a low capacitance so that it is easy to fill the trenches. After that, a leveling process is carried out using CMP or the like, so that extra parts of the second interlayer insulating film 34 are removed and the second electrode 32 are exposed, and thus a block body is formed. FIG. 9 shows the block body after the leveling process.

Figure 10:
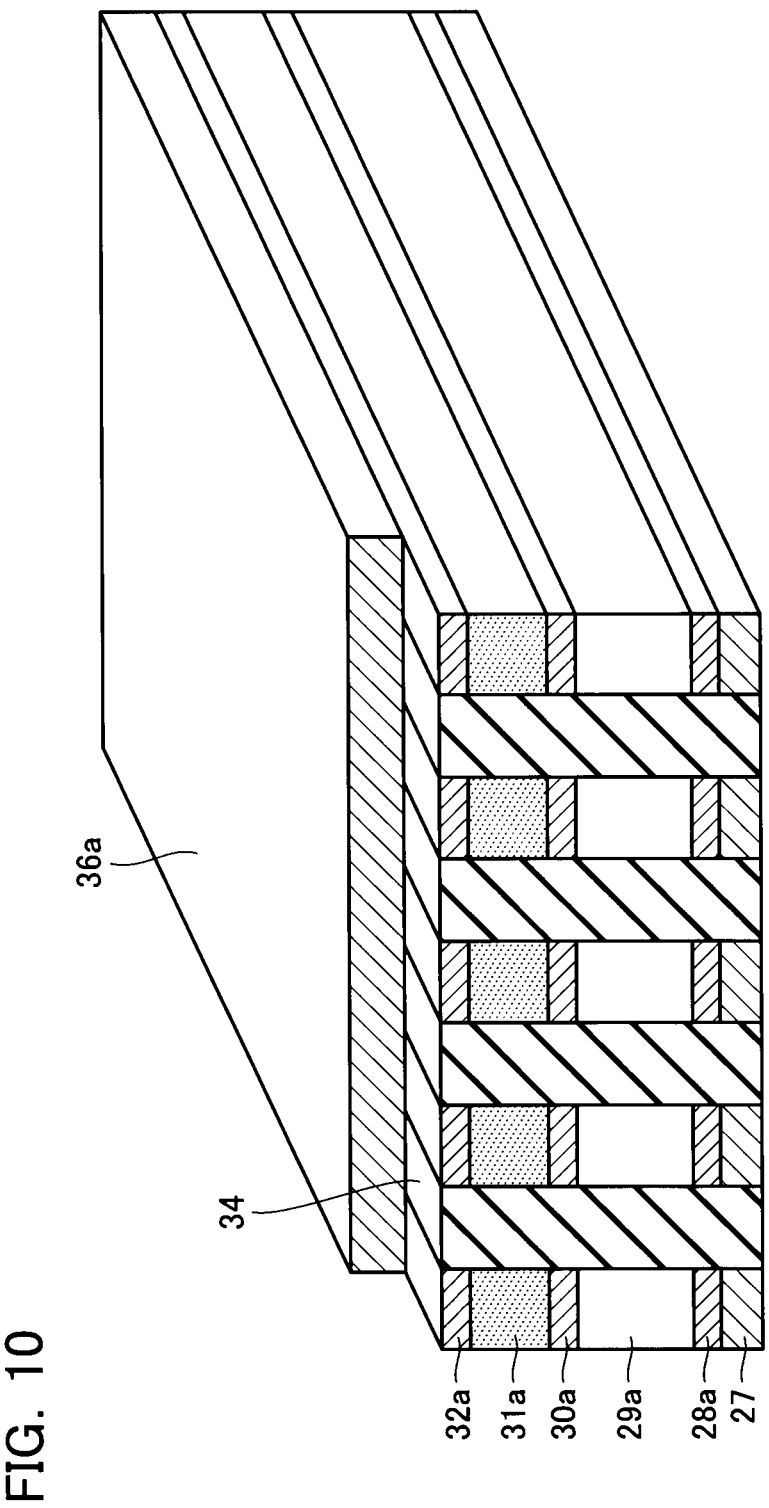
FIG. 10 is a perspective view showing the next step of forming the upper layer portion of the nonvolatile memory according to the first embodiment.

Next, a layer 36a of W (second wire material) is layered on the leveled portion of the block body after CMP as a second metal 36. FIG. 10 shows the state after this step.

Figure 11:
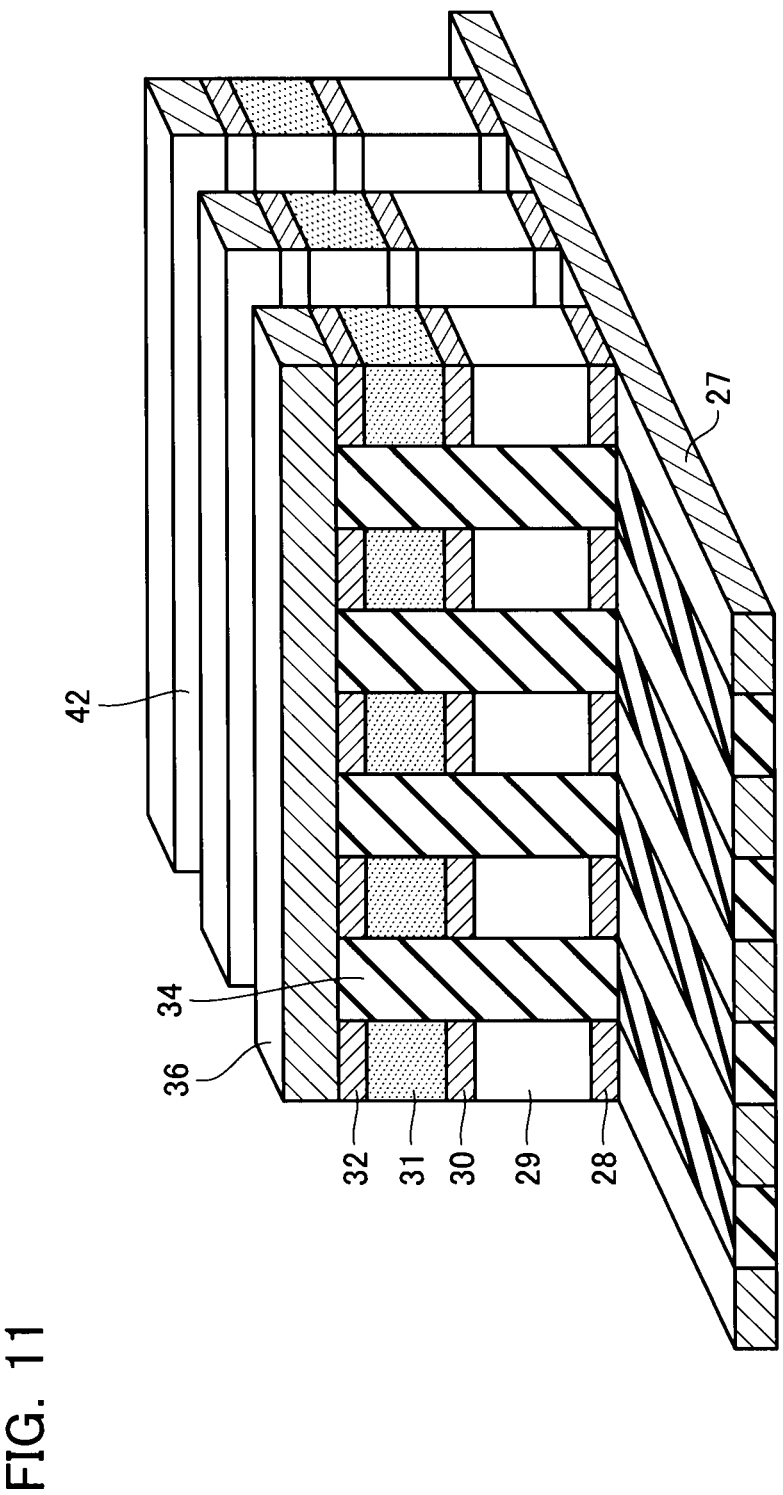
FIG. 11 is a perspective view showing the next step of forming the upper layer portion of the nonvolatile memory according to the first embodiment.
Figure 12:
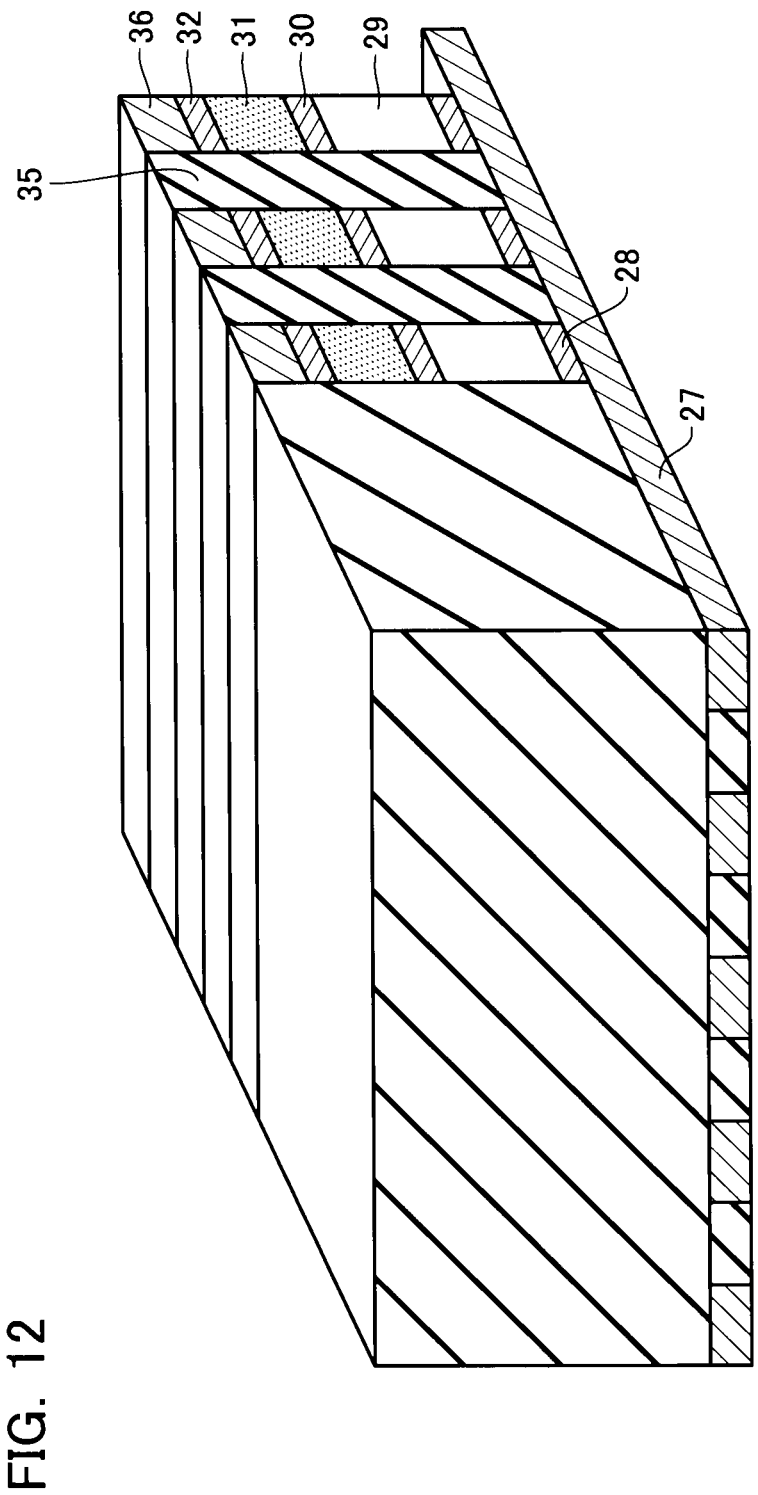
FIG. 12 is a perspective view showing the next step of forming the upper layer portion of the nonvolatile memory according to the first embodiment.

Next, a second etching process is carried out in the direction of the columns L/S. As a result, second trenches 42 are created along the bit lines BL, which are perpendicular to the word lines WL, as shown in FIG. 11, and at the same time, memory cells MC in pillar form are separately formed at cross points between the word lines WL and the bit lines BL in a self-aligned manner. After that, the spaces are filled with the third interlayer insulating film 35, and the third interlayer insulating film 35 is leveled, so that a cross point type memory cell layer can be formed as shown in FIG. 12.

As described above, solid films are layered on top of each other and patterned twice for L/S, which are perpendicular to each other, and thus, cells are formed at cross points and aligned with wires in a self-aligned manner.

In addition, it is possible to form a memory cell array having a multilayer structure by repeating the formation of the above-described multilayer structure.

Figure 13:
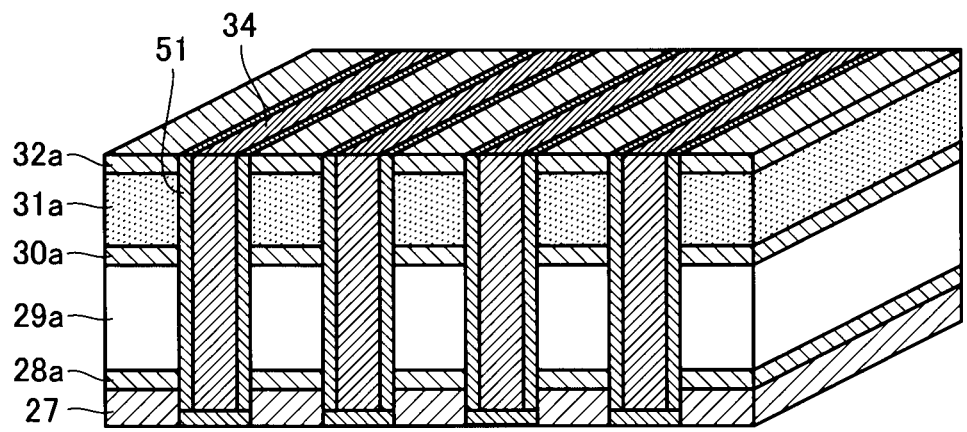
FIG. 13 is a perspective view showing another step of forming the upper layer portion of the nonvolatile memory according to the first embodiment.

As shown in FIG. 13, a protective film 51 of an oxide film may be formed in the first trenches 41 after the first etching process and before the trenches are filled with the second interlayer insulating film 34. Likewise, a protective film of an oxide film may be formed in the second trenches 42 after the second etching process and before the trenches are filled with the third interlayer insulating film 35. Here, an oxide of a so-called rare earth element, such as Cr, W or V, can be used for the oxide films. In addition, it is possible to use $Al_2O_3$, CuO or $SiO_2$. Thus, the protective film 51 can be formed so that the resistance value can be optimized at the time of setting, and the current leaking through the side walls of the metal oxide films can be reduced. In addition, the data retaining properties can be improved.

In the case of the memory cell array manufactured through the above-described process, the memory cells have a structure where wires, barrier metals, non-ohmic elements such as diodes, first electrodes, variable resistance elements, second electrodes and wires are layered in sequence from the bottom layer up in all of the memory cell layers, as shown in FIG. 3.

When memory cell layers are formed, a lot of processes during which heat is applied are carried out, such as film formation and formation of a protective film. Therefore, the lower the layer, the greater the thermal history effects.

In the present embodiment, the variable resistance elements VR are layered above the non-ohmic elements NO, and therefore, the variable resistance elements VR have a smaller area in a cross section. As a result, the cell current can be made smaller, so that the power consumption can be reduced. In addition, when the non-ohmic elements NO are layered beneath the variable resistance elements VR, the non-ohmic elements NO have a greater area in a cross section, so that a current in the forward direction is higher and the maximum value of the capacitance for the current is higher. Meanwhile, when the variable resistance elements VR are layered beneath the non-ohmic elements NO, the cell current is greater, and the switching probability and the durability can be expected to increase. Furthermore, the diodes are smaller in size, and therefore, the current flowing in the opposite direction through the diodes can be reduced.

As described above, in the present embodiment, the order of the layers in the memory cells is the same in different layers of the semiconductor memory having a multilayer structure, and thus, it is possible to reduce inconsistency in the properties of the variable resistance elements VR and the non-ohmic elements NO between different layers. As a result, at least one of an on-cell current, an off-cell current, an on-cell resistance, and an off-cell resistance of the memory cells being included in the different layers can be made substantially the same.

[Second Embodiment]

A nonvolatile memory having a memory cell array with a multilayer structure in the case where word lines WL, which are first wires, and bit lines BL, which are second wires, are shared by the memory cell layers according to a second embodiment of the present invention is described below.

First, the method for manufacturing the nonvolatile memory according to the present embodiment is described with reference to FIGS. 14 to 19.

Figure 14:
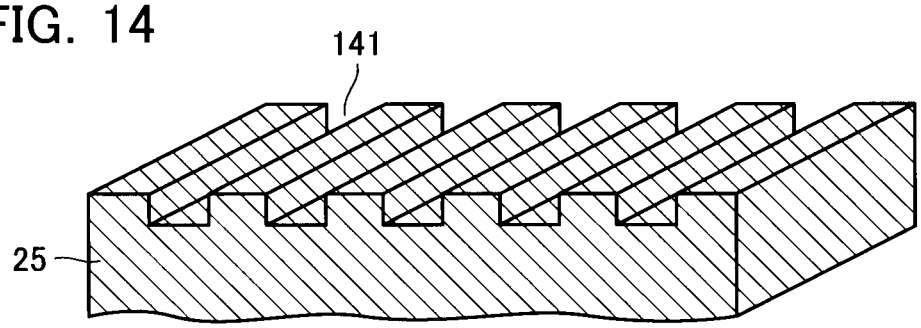
FIG. 14 is a perspective view showing one of the steps of forming an upper layer portion of a nonvolatile memory according to a second embodiment of the present invention.

First, as shown in FIG. 14, a resist pattern for word lines WL is formed through photolithography, in order to form word lines WL as damascene wires after the first interlayer insulating film 25 is formed. After that, the oxide film in the parts where there is no resist is etched, so that first trenches 141 extending in the direction of rows, which is the first direction, are created.

Figure 15:
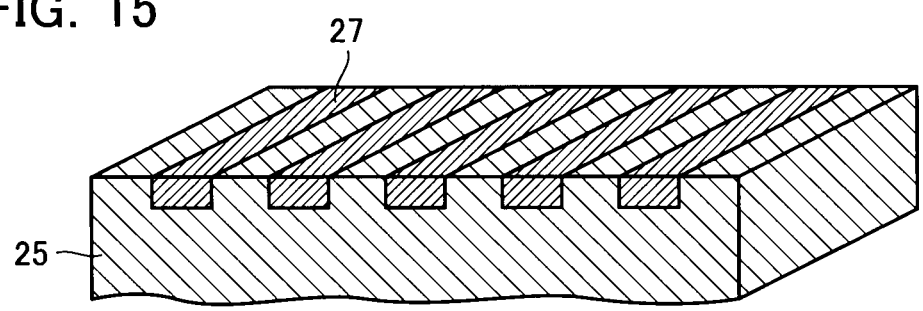
FIG. 15 is a perspective view showing the next step of forming the upper layer portion of the nonvolatile memory according to the second embodiment.

Next, as shown in FIG. 15, the created first trenches 141 are filled with a wire material that becomes a first metal 27, such as TiN or W. After that, the top surface of the first interlayer insulating film 25 and the first metal 27 is leveled through CMP. As a result, word lines WL are formed so as to extend in the direction of rows.

Figure 16:
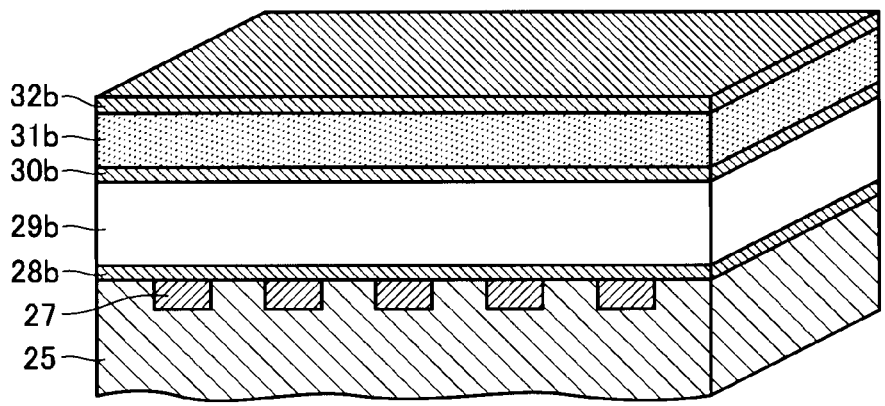
FIG. 16 is a perspective view showing the next step of forming the upper layer portion of the nonvolatile memory according to the second embodiment.

Next, as shown in FIG. 16, in order to form memory cells, layers 28b, 29b, 30b, 31b and 32b are sequentially deposited on the top surface of the first interlayer insulating film 25 and the first metal 27, which are leveled in the step in FIG. 15, as a barrier metal 28, non-ohmic elements 29, which are first elements, first electrodes 30, variable resistive elements 31, which are second elements, and second electrodes 32. Here, the non-ohmic elements 29 are PN junction diodes made of polysilicon (p-Si) doped in-situ having a P type semiconductor (semiconductor of a first conductivity type) and an N type semiconductor (semiconductor of a second conductivity type) from the bottom layer up.

Figure 17:
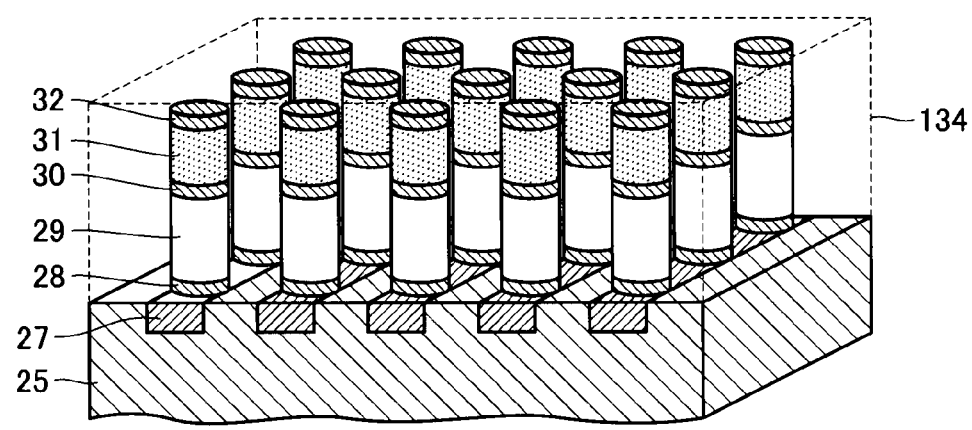
FIG. 17 is a perspective view showing the next step of forming the upper layer portion of the nonvolatile memory according to the second embodiment.

Next, as shown in FIG. 17, a resist pattern is formed through photolithography, so that memory cells can be formed at cross points between the word lines WL (first metal 27) and the bit lines BL (second metal 36) to be formed afterward. After that, anisotropic etching is carried out, and the etched portions have such a depth as to hit the bottom of the layer 28a, so that memory cells MC are formed in pillar form. After that, a second interlayer insulating film 134 is layered so as to cover the exposed first interlayer insulating film 25, the first metal 27 and the memory cells MC. Here, the second interlayer insulating film 134 is deposited up to the same height as the bit lines BL, which is formed on the top surface of the second electrodes 32 in a later process.

Figure 18:
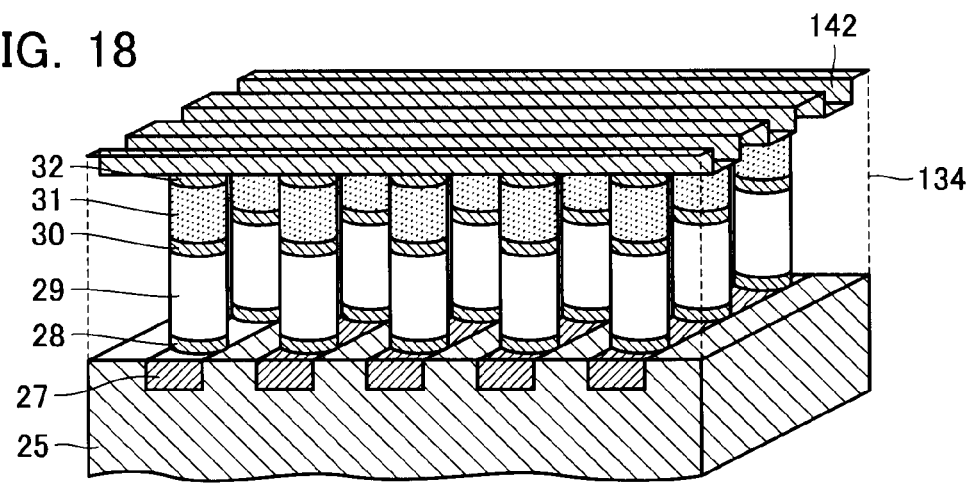
FIG. 18 is a perspective view showing the next step of forming the upper layer portion of the nonvolatile memory according to the second embodiment.

Next, as shown in FIG. 18, a resist pattern for bit lines BL is formed through photolithography in order to form bit lines BL as damascene wires after the second interlayer insulating film 134 is deposited. After that, the oxide film in parts where there is no resist is etched, so that the top surface of the second electrodes 32 is exposed. As a result, second trenches 142 extending in the direction of columns, which is the second direction, are created.

Figure 19:
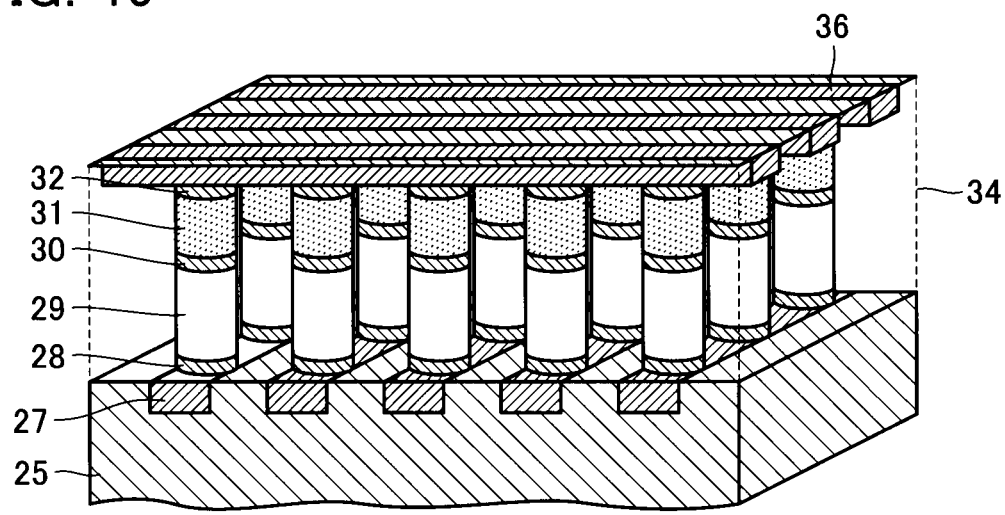
FIG. 19 is a perspective view showing the next step of forming the upper layer portion of the nonvolatile memory according to the second embodiment.

Next, as shown in FIG. 19, the second trenches 142 are filled with a wire material that becomes the second metal 36, such as TiN or W, after which the top surface of the second interlayer insulating film 134 and the second metal 36 is leveled through CMP. As a result, bit lines BL extending in the direction of columns are formed.

According to another method for forming bit lines BL, the second interlayer insulating film 134 is deposited and then CMP is carried out so that the second interlayer insulating film is leveled. At this time, a stopper for CMP may be deposited on top of the upper electrodes. After that, an interlayer insulating film for forming damascene wires is deposited, a pattern for photolithography is formed, a material for bit lines BL is deposited, and CMP is carried out, so that bit lines BL are formed.

Thereafter the steps in FIGS. 16 to 19 are repeated, so that a memory cell array with a multilayer structure is manufactured. At this time, it is necessary to switch the direction in which the metal wires are etched between the direction of rows and the direction of columns alternately, and it is necessary for P type semiconductor-N type semiconductor and N type semiconductor-P type semiconductor layers to alternate.

Figure 20:
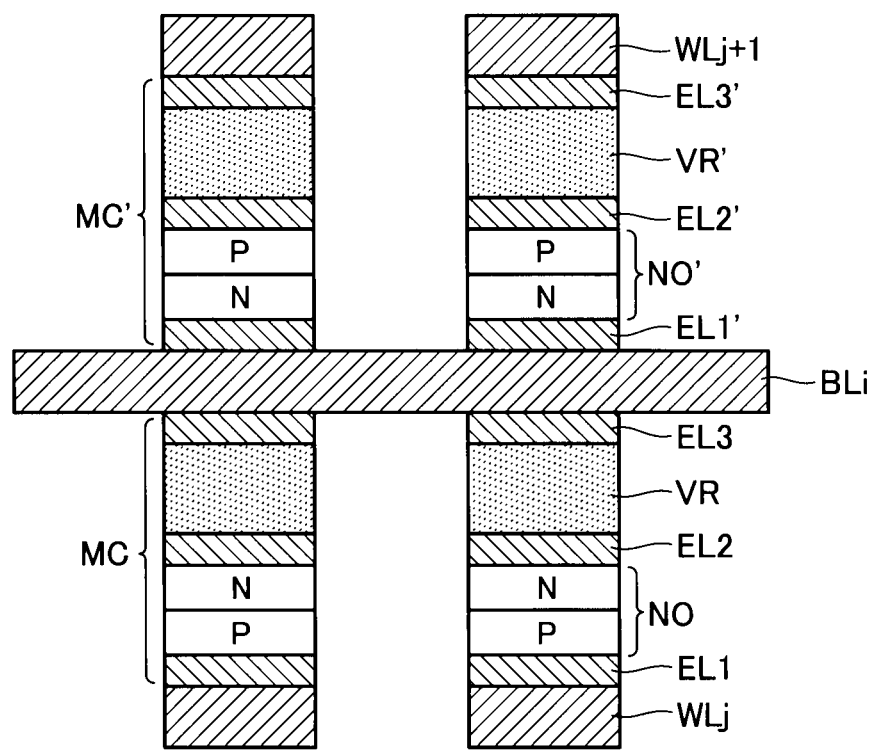
FIG. 20 is a cross-sectional view showing memory cells of the nonvolatile memory according to the second embodiment.

FIG. 20 is a cross-sectional view showing part of a memory cell array manufactured in accordance with the above-described process in the direction of columns.

As shown in FIG. 20, memory cells MC formed at cross points between the word lines WLj and bit lines BLi have a structure where an electrode EL1, a diode made of a P type semiconductor/N type semiconductor, which is a non-ohmic element NO, an electrode EL2, a variable resistance element VR and an electrode EL3 are layered in sequence from the bottom layer up.

Meanwhile, memory cells MC' formed at cross points between the bit lines BLi and word lines WLj+i in the upper layer have the same multilayer structure as the memory cells MC, except that a P type semiconductor is layered on top of an N type semiconductor. At this time, when materials and/or thicknesses of the upper and lower electrodes EL3 and EL2 of the variable resistance element VR are different each other, the upper and lower electrodes EL3 and EL2 for the variable resistance element VR can be switched in the same manner. In this case, the materials and the thicknesses of the upper and lower electrodes of the lower memory cell MC and the upper memory cell MC' can be switched.

As described above, the P type semiconductor and the N type semiconductor for the diodes are layered in the opposite order between the upper and lower layers, and as a result, two adjacent memory cell layers can share one wire (bit line BLi in the case in FIG. 20) without changing the basic multilayer structure of the memory cell layers.

Figure 29:
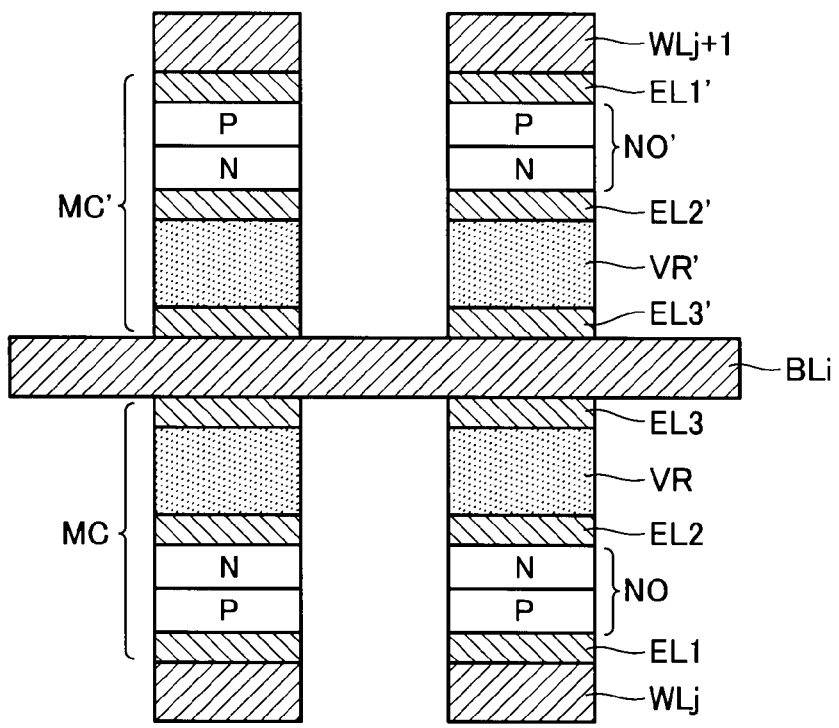
FIG. 29 is a cross-sectional view showing memory cells of a nonvolatile memory according to a comparative example.

FIG. 29 is a cross-sectional view showing part of a memory cell array having a mirror structure with a word line WL or a bit line BL at the center as a comparative example.

In the case in FIG. 29, the memory cells MC formed at cross points between word lines WLj and bit lines BLi are the same as in the case of the present embodiment shown in FIG. 20.

Meanwhile, the memory cells MC' have a multilayer structure layered in the opposite order to the memory cells MC. That is to say, an electrode EL3, a variable resistance element VR, an electrode EL2, a diode made of an N type semiconductor/P type semiconductor which is a non-ohmic element NO, and an electrode EL1 are layered from the bottom layer up.

In the case where memory cells MC are formed through etching, the memory cells usually have a tapered form where the area in a cross section becomes gradually smaller from the bottom layer towards the top layer.

Regarding this, diodes-variable resistance elements VR and variable resistance elements VR-diodes alternate layer by layer in the comparative example, and therefore, the properties of the memory cells are inconsistent between memory cell layers.

In the present embodiment, however, the variable resistance elements VR and the non-ohmic elements, for example the diodes, are layered in the same order for all of the memory cell layers, and therefore, the variable resistance elements and the non-ohmic elements have the same size in all of the memory cells, and thus, the inconsistency in the properties between the memory cell layers can be reduced, as in the first embodiment. Here, in the case where the variable resistance elements VR are provided in the upper layer, the cell current that flows at the time of switching can be small, because of the dependency of the cell current on the size during the setting/ resetting operation, and thus, the power consumption can be reduced. In addition, the switching probability and the durability can be expected to increase. Furthermore, even in the case where the cell current is large, the size of the diodes is relatively large, and therefore, the current flowing through the diodes in the forward direction can be increased, and as a result, the withstand voltage of the diodes can be increased. Meanwhile, in the case where the variable resistance elements VR are provided in the lower layer, the cell current can be increased, and the switching probability and the durability can be expected to increase. Furthermore, the size of the diodes is small, and therefore, the current flowing through the diodes in the backward direction can be reduced.

Figure 21:
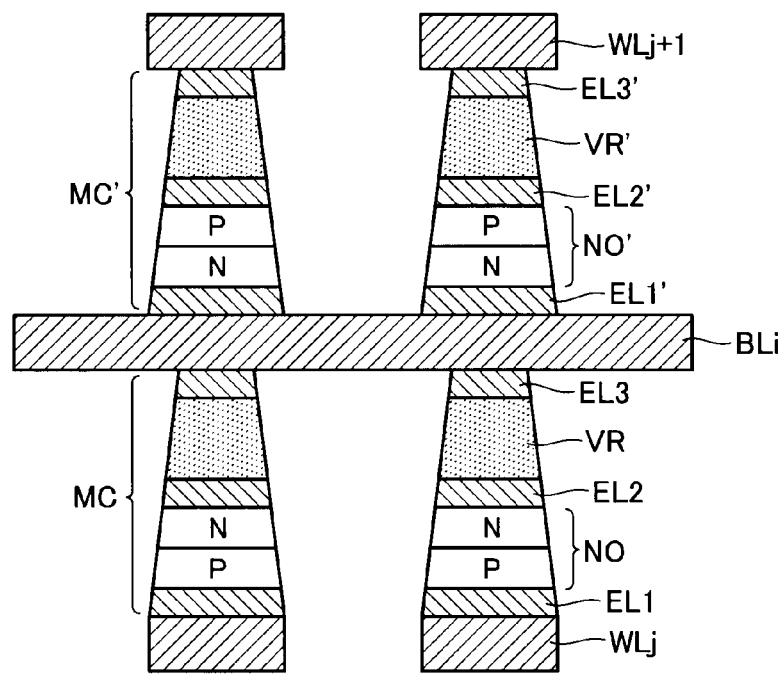
FIG. 21 is a cross-sectional view showing other memory cells of the nonvolatile memory according to the second embodiment.

In addition, these effects can be made more significant when the memory cells MC are more tapered, as shown in FIG. 21.

Although variable resistance elements (second elements) are layered in the layer above the non-ohmic elements (first elements), for example the diodes, as in the above description, in the case where non-ohmic elements (second elements) are layered in the layer above the variable resistance elements (first elements) instead, the inconsistency in the properties of the memory cells between the memory cell layers can be reduced. In this case, the area of the variable resistance elements is large in a cross section, and the switching probability can be increased.

[Third Embodiment]

A case where an L/S process is simultaneously carried out on two memory cell layers through etching according to a third embodiment of the present invention is described below. FIGS. 22 to 27 show the process for a nonvolatile memory in this case.

The steps up to the layering of the layer 36a as a second metal 36 are the same as in the process according to the first embodiment in FIGS. 7 to 10, except that the layer 33a, which becomes a stopper 33, is inserted between the layer 32a, which becomes a second electrode 32, and the layer 36a, which becomes a second metal 36. Here, the stopper 33 helps to detect the completion of CMP.

Figure 22:
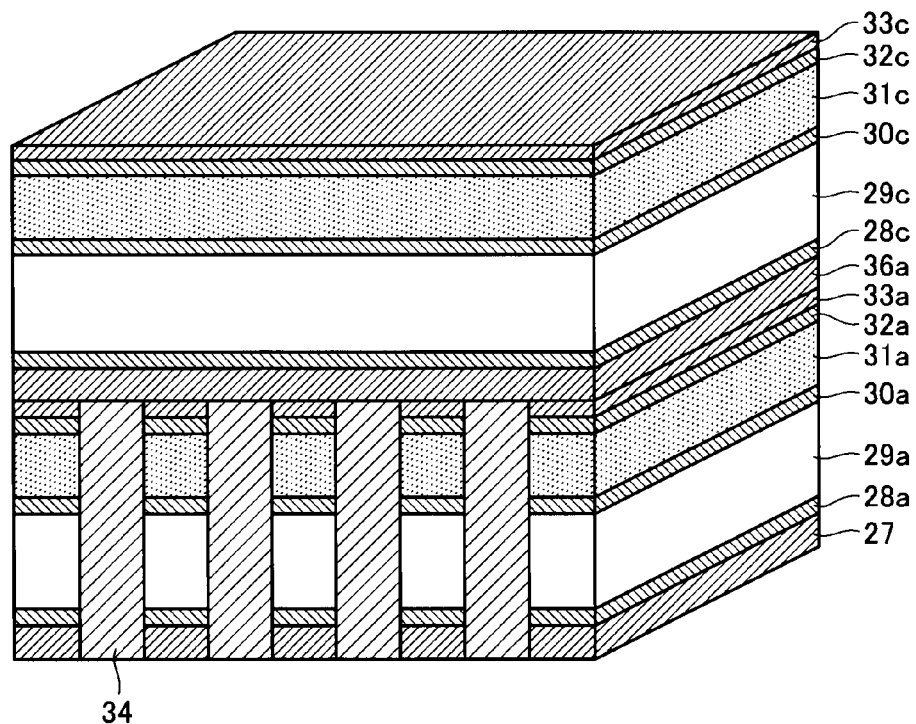
FIG. 22 is a perspective view showing one of the steps of forming an upper layer portion of a nonvolatile memory according to a third embodiment of the present invention.

After that, as shown in FIG. 22, layers 28c, 29c, 30c, 31c, 32c and 33c are deposited in sequence on the top surface of the layer 36a, which becomes the second metal 36, as the barrier metal 28' of the memory cells MC' in the upper memory cell layer, the non-ohmic elements 29', the first electrodes 30', the variable resistance elements 31', the second electrodes 32' and the stopper 33', respectively.

Figure 23:
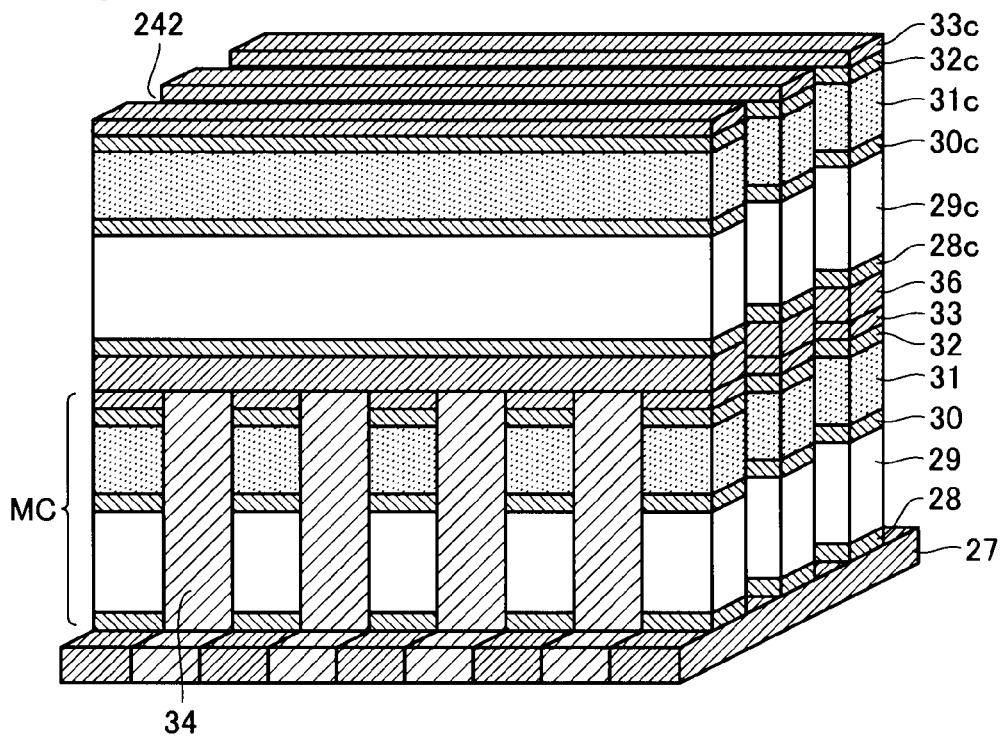
FIG. 23 is a perspective view showing the next step of forming the upper layer portion of the nonvolatile memory according to the third embodiment.

Next, as shown in FIG. 23, a second etching process for L/S is carried out, so that the etched portion hits the bottom surface of the layer 28a, which becomes a barrier metal 28, in the direction of columns. As a result, second trenches 242 are created along the bit lines BLi, which are perpendicular to the word lines Wlj, and at the same time, separate memory cells MC in pillar form are formed in the lower layer at cross points between the word lines WLj and the bit lines BLi in a self-aligned manner.

Figure 24:
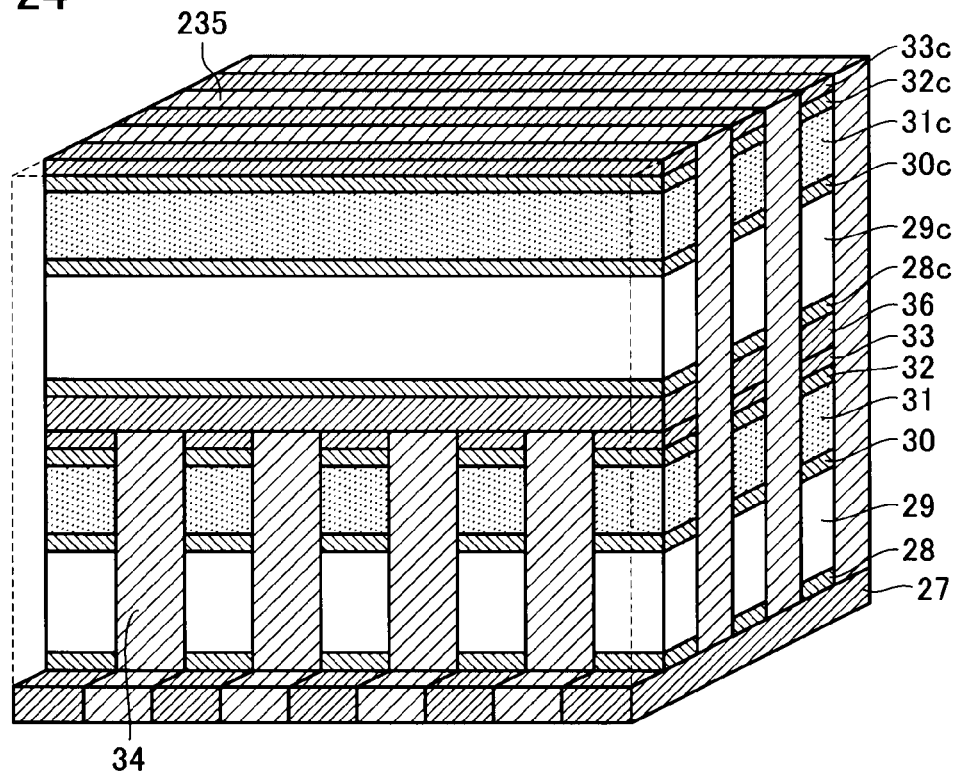
FIG. 24 is a perspective view showing the next step of forming the upper layer portion of the nonvolatile memory according to the third embodiment.

Next, as shown in FIG. 24, the second trenches 242 are filled with a third interlayer insulating film 235, and the third interlayer insulating film 235 is leveled.

Figure 25:
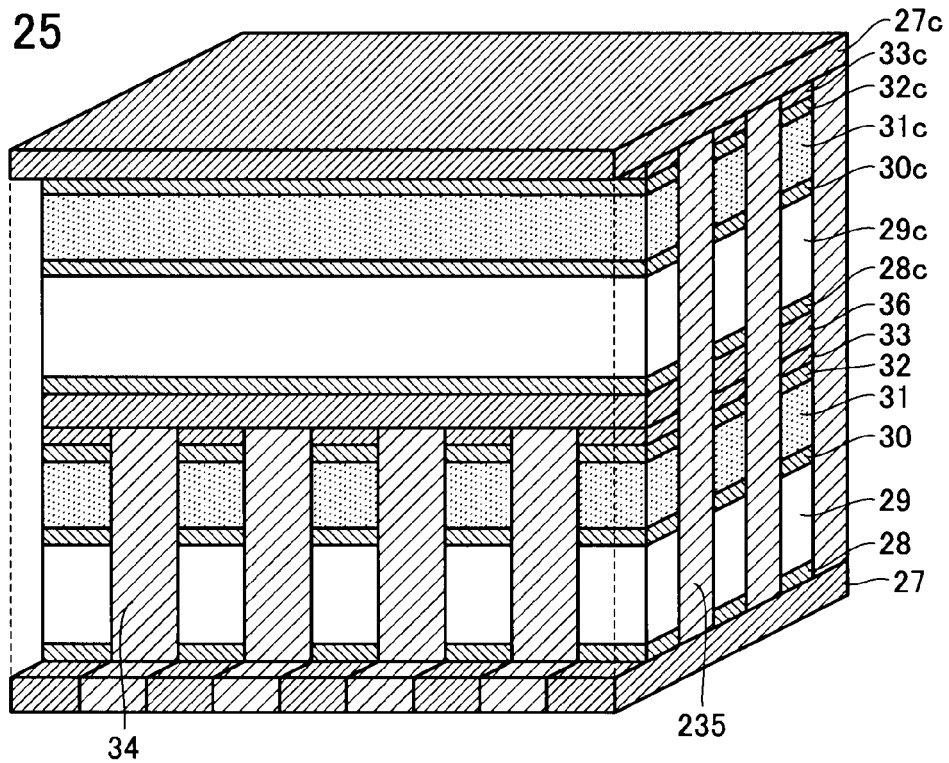
FIG. 25 is a perspective view showing the next step of forming the upper layer portion of the nonvolatile memory according to the third embodiment.

Next, as shown in FIG. 25, a layer 27c is deposited on the top surface of the leveled layer 33c and the third interlayer insulating film 235 as a third metal 27'.

Figure 26:
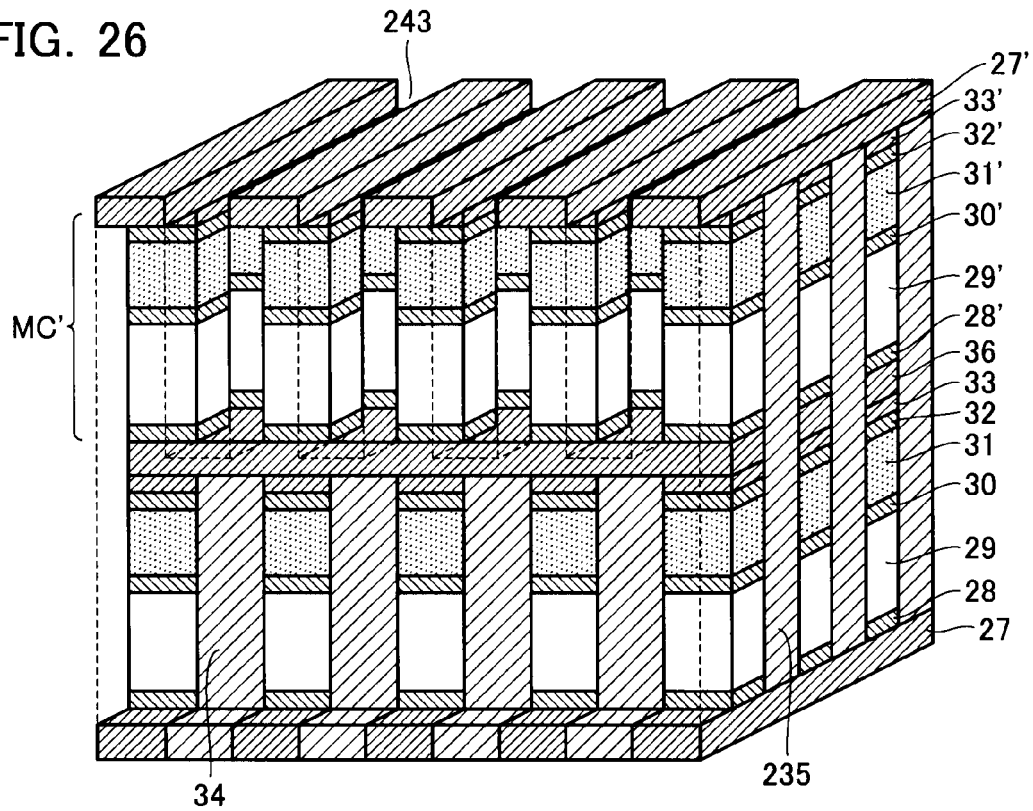
FIG. 26 is a perspective view showing the next step of forming the upper layer portion of the nonvolatile memory according to the third embodiment.

Next, as shown in FIG. 26, the third etching process is carried out so as to have such a depth that the etched portions hit the bottom surface of the layer 28c in the direction of rows. As a result, third trenches 243 are created along the word lines WLj+1, which are perpendicular to the bit lines BLi, and at the same time, separate memory cells MC' in pillar form are formed in the upper layer at cross points between the bit lines BLi and the word lines WLj+1 in a self-aligned manner.

Figure 27:
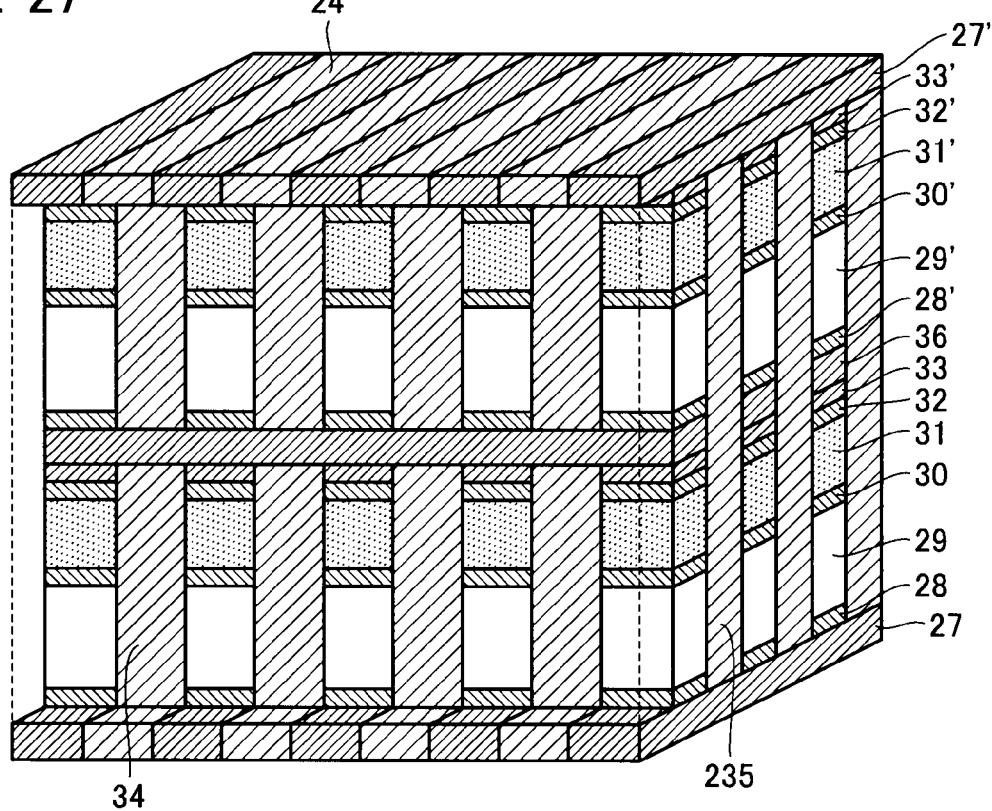
FIG. 27 is a perspective view showing the next step of forming the upper layer portion of the nonvolatile memory according to the third embodiment.

Finally, as shown in FIG. 27, the third trenches 243 are filled with a fourth interlayer insulating film 34', and the fourth interlayer insulating film 34' is leveled.

In accordance with the above-described process, a nonvolatile memory having two memory cell layers can be manufactured.

Here, deposition of a metal layer and a memory cell material, anisotropic etching in the direction of rows, deposition of an interlayer insulating film, deposition of a metal layer and a memory cell material, anisotropic etching in the direction of columns and deposition of an interlayer insulating film can be repeated after the process up to deposition of the layer 27c as the third metal layer 27 in FIG. 24, so that a memory cell array with a multilayer structure can be manufactured.

Figure 28:
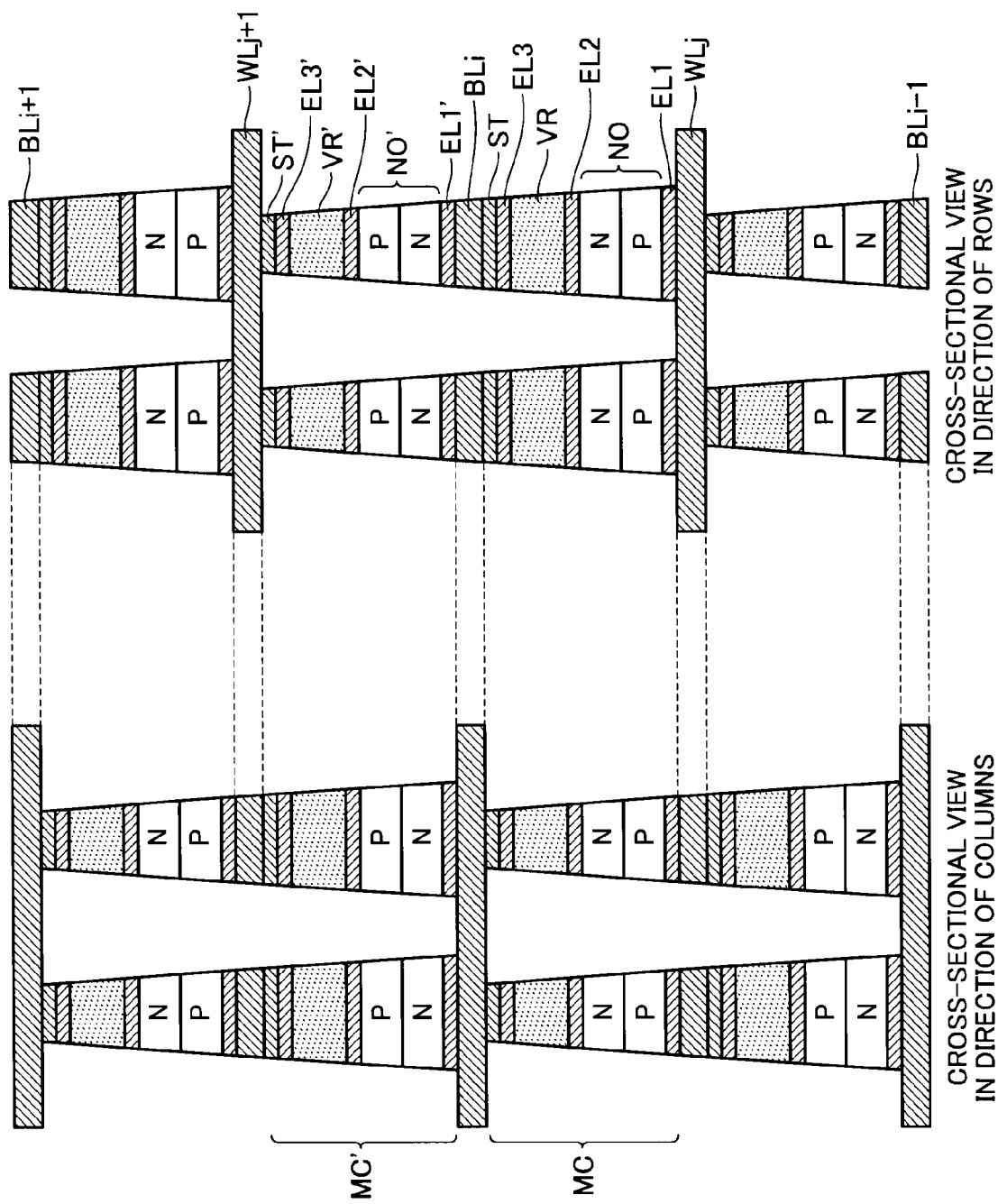
FIG. 28 is a cross-sectional view showing memory cells of the nonvolatile memory according to the third embodiment.

FIG. 28 shows part of the memory cell array manufactured in accordance with the above-described process; the left and right diagrams are cross-sectional views in the direction of columns and the direction of rows, respectively. In the memory cell array shown in FIG. 28, memory cells MC are provided in the lower layer at cross points between the word lines WLj and bit lines BLi, and memory cells MC' are provided in the upper layer at cross points between the bit lines BLi and word lines WLj+1.

The memory cells MC have a structure where an electrode EL1, a P type semiconductor/N type semiconductor for a diode, which is a non-ohmic element NO, an electrode EL2, a variable resistance element VR, an electrode EL3 and a stopper ST are layered in this order from the word line WLj to the bit line BLi.

The memory cells MC' have a structure where an electrode EL1, an N type semiconductor/P type semiconductor for a diode, which is a non-ohmic element NO, an electrode EL2, a variable resistance element VR, an electrode EL3 and a stopper ST are layered in this order from the bit line BLi to the word line WLj+1. Here, when materials and/or thicknesses of the upper and lower electrodes EL3 and EL2 of the variable resistance element VR are different each other, the upper and lower electrodes EL3 and EL2 for the variable resistance element VR can be switched. In this case, the materials and the thicknesses of the upper and lower electrodes of the lower memory cell MC and the upper memory cell MC' can be switched.

In addition, the L/S process in FIG. 22 is carried out on two layers at the same time, and therefore, the memory cells MC and the memory cells MC' have a tapered form where the area becomes continuously smaller from the bottom surface of the memory cells MC towards the top surface of the memory cells MC' in a cross section.

In this case also, the variable resistance elements VR are layered above the diodes, which are non-ohmic elements NO, in all of the memory cell layers, and therefore, the area of the diodes is greater than the area of the variable resistance elements VR in a cross section. As a result, the current that flows through the variable resistance elements VR is small, so that the power consumption can be reduced, and at the same time, the maximum value of the current that flows through the diodes in the forward direction can be increased.

In addition, the above-described L/S process is carried out every two layers, and therefore, there is a possibility that the properties may be different between even-numbered memory cell layers and odd-numbered memory cell layers. Even in this case, however, it is possible for the area in a cross section at the same height to be approximately the same between even-numbered memory cell layers and odd-numbered memory cell layers, and therefore, the inconsistency in the memory cell properties can be reduced between even-numbered memory cell layers and between odd-numbered memory cell layers. As a result, at least one of an on-cell current and an off-cell current of the memory cells being included in at least one of the even-numbered memory cell layers and the odd-numbered memory cell layers can be made substantially the same. Moreover, at least one of an on-cell resistance and an off-cell resistance of the memory cells being included in at least one of the even-numbered memory cell layers and the odd-numbered memory cell layers can be made substantially the same.

Furthermore, in the case where the variable resistance elements VR are provided in the upper layer, the cell current that flows at the time of switching can be reduced, because of the dependency of the cell current on the size during the setting and resetting operation, and thus, the power consumption can be reduced, as in the above-described embodiments. In addition, the switching probability and durability can be expected to increase. Furthermore, even in the case where the cell current is large, the size of the diodes is relatively large, and therefore, the current flowing through the diodes in the forward direction can be increased. As a result, the withstand voltage of the diodes can be increased. Meanwhile, in the case where the variable resistance elements VR are provided in the lower layer, the cell current can be increased, and the switching probability and durability can be expected to increase.

Furthermore, since the size of the diodes is small, the current flowing through the diodes in the backward direction can be reduced.

[Other]

The present invention is not limited to memory cells made of a variable resistance element and a diode, as described above, and can be applied to various memory devices having a cross point type multilayer structure, such as phase variable memory elements, MRAM elements, PFRAM and the like.

What is claimed is:

1. A nonvolatile semiconductor memory device, comprising a memory cell array in which a plurality of memory cell layers having a plurality of first and second wires which cross each other and a memory cell provided at each intersection of these first and second wires are laminated on top of each other,
    the memory cells having a variable resistance element and a non-ohmic element laminated in a direction in which the memory cell layers are laminated,
    the variable resistance element and the non-ohmic element of the memory cells being laminated in the same order between a certain memory cell layer and another memory cell layer,
    the first or second wires being shared by a first memory cell layer and a second memory cell layer of the plurality of memory cell layers, the first and second memory cell layers being adjacent in the direction in which the layers are laminated, and
    the memory cells being tapered in such a manner that an area in a cross section gradually becomes smaller from a bottom of the first memory cell layer towards the top of the second memory cell layer.

2. The nonvolatile semiconductor memory device according to claim 1, wherein
    at least one of a current and a resistance of the memory cells being included in the different memory cell layers are substantially the same.

3. The nonvolatile semiconductor memory device according to claim 1, wherein
    each of the non-ohmic elements comprises a diode made of a P type semiconductor and an N type semiconductor laminated in the direction in which the memory cell layers are laminated, and
    the P type semiconductor and the N type semiconductor are laminated in the opposite order between the diodes in the first memory cell layer and the diodes in the second memory cell layer.

4. The nonvolatile semiconductor memory device according to claim 1, wherein the non-ohmic element and the variable resistance element are laminated in this order in the memory cells in the direction from the bottom layer towards the top layer or from the top layer towards the bottom layer in the memory cell array.

5. The nonvolatile semiconductor memory device according to claim 1, wherein
    the memory cells in an $i^{th}$ (i is a natural number) memory cell layer, counting in the direction in which the plurality of memory cell layers are laminated, and the memory cells in a $(i+2)^{th}$ memory cell layer have substantially the same width in the direction of the first wires at the same height in each layer, and
    the memory cells in a $(i+1)^{th}$ memory cell layer and the memory cells in a $(i+3)^{th}$ memory cell layer have substantially the same width in the direction of the second wires at the same height in each layer.

6. The nonvolatile semiconductor memory device according to claim 1, wherein sidewalls in the direction of the first wires of the memory cells in the $i^{th}$ (i is a natural number) memory cell layer, counting in the direction in which the plurality of memory cell layers are laminated, and sidewalls of the memory cells in the $(i+1)^{th}$ memory cell layer are formed in substantially the same planes, and sidewalls in the direction of the second wires of the memory cells in the $(i+1)^{th}$ memory cell layer and sidewalls in the direction of the second wires of the memory cells in the $(i+2)^{th}$ memory cell layer are formed in substantially the same planes.

7. The nonvolatile semiconductor memory device according to claim 1, wherein
at least one of a current and a resistance of the memory cells being included in a $i^{th}$ is a natural number) memory cell layer and a $(i+2)^{th}$ memory cell layer are substantially the same, and
at least one of a current and a resistance of the memory cells being included in a $(i+1)^{th}$ memory cell layer and a $(i+3)^{th}$ memory cell layer are substantially the same.

8. The nonvolatile semiconductor memory device according to claim 1, wherein a protective film is formed of an oxide film on the sidewalls of the memory cells.

9. A nonvolatile semiconductor memory device, comprising a memory cell array where a plurality of memory cell layers having a plurality of first and second wires which cross each other and a memory cell provided at each intersection of these first and second wires are laminated on top of each other,
the memory cells having a variable resistance element and a non-ohmic element laminated in a direction in which the memory cell layers are laminated,
the variable resistance element and the non-ohmic element of the memory cells in a certain memory cell layer being laminated in the same order and have substantially the same size as the variable resistance element and the non-ohmic element of the memory cells in another memory cell layer,
the first or second wires being shared by a first memory cell layer and a second memory cell layer of the plurality of memory cell layers, the first and second memory cell layers being adjacent in the direction in which the layers are laminated, and
the memory cells being tapered in such a manner that an area in a cross section gradually becomes smaller from a bottom of the first memory cell layer towards the top of the second memory cell layer.

10. The nonvolatile semiconductor memory device according to claim 9, wherein
each of the non-ohmic elements comprises a diode made of a P type semiconductor and an N type semiconductor laminated in the direction in which the memory cell layers are laminated, and
the P type semiconductor and the N type semiconductor are laminated in the opposite order between the diodes in the first memory cell layer and the diodes in the second memory cell layer.

11. The nonvolatile semiconductor memory device according to claim 9, wherein the non-ohmic element and the variable resistance element are laminated in this order in the memory cells in the direction from the bottom layer towards the top layer or from the top layer towards the bottom layer in the memory cell array.

12. The nonvolatile semiconductor memory device according to claim 9, wherein
the memory cells in an $i^{th}$ (i is a natural number) memory cell layer, counting in the direction in which the plurality of memory cell layers are laminated, and the memory cells in a $(i+2)^{th}$ memory cell layer have substantially the same width in the direction of the first wires at the same height in each layer, and
the memory cells in a $(i+1)^{th}$ memory cell layer and the memory cells in a $(i+3)^{th}$ memory cell layer have substantially the same width in the direction of the second wires at the same height in each layer.

13. The nonvolatile semiconductor memory device according to claim 9, wherein
sidewalls in the direction of the first wires of the memory cells in the $i^{th}$ (i is a natural number) memory cell layer, counting in the direction in which the plurality of memory cell layers are laminated, and sidewalls of the memory cells in the (i+1) memory cell layer are formed in substantially the same planes, and sidewalls in the direction of the second wires of the memory cells in the $(i+1)^{th}$ memory cell layer and sidewalls in the direction of the second wires of the memory cells in the $(i+2)^{th}$ memory cell layer are formed in substantially the same planes.

14. The nonvolatile semiconductor memory device according to claim 9, wherein a protective film is formed of an oxide film on the sidewalls of the memory cells.

* * * * *